(12) United States Patent
Sasagawa et al.

(10) Patent No.: US 9,214,565 B2
(45) Date of Patent: Dec. 15, 2015

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shinya Sasagawa, Chigasaki (JP); Motomu Kurata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/493,383

(22) Filed: Sep. 23, 2014

(65) Prior Publication Data

US 2015/0041805 A1 Feb. 12, 2015

Related U.S. Application Data

(62) Division of application No. 13/666,150, filed on Nov. 1, 2012, now Pat. No. 8,878,177.

(30) Foreign Application Priority Data

Nov. 11, 2011 (JP) .................................. 2011-247907

(51) Int. Cl.
*H01L 29/12* (2006.01)
*H01L 29/786* (2006.01)
(Continued)

(52) U.S. Cl.
CPC ............ *H01L 29/7869* (2013.01); *H01L 21/34* (2013.01); *H01L 29/42384* (2013.01);
(Continued)

(58) Field of Classification Search
CPC ...................... H01L 29/7869; H01L 29/78618
USPC ............................................................ 257/43
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Theresa T Doan
(74) *Attorney, Agent, or Firm* — Eric J. Robinson; Robinson Intellectual Property Law Office, P.C.

(57) ABSTRACT

Provided is a miniaturized transistor having high electrical characteristics. The transistor includes a source electrode layer in contact with one side surface of the oxide semiconductor layer in the channel-length direction and a drain electrode layer in contact with the other side surface thereof. The transistor further includes a gate electrode layer in a region overlapping with a channel formation region with a gate insulating layer provided therebetween and a conductive layer having a function as part of the gate electrode layer in a region overlapping with the source electrode layer or the drain electrode layer with the gate insulating layer provided therebetween and in contact with a side surface of the gate electrode layer. With such a structure, an Lov region is formed with a scaled-down channel length maintained.

18 Claims, 15 Drawing Sheets

(51) Int. Cl.
*H01L 29/423* (2006.01)
*H01L 29/49* (2006.01)
*H01L 21/34* (2006.01)
*H01L 29/78* (2006.01)
*H01L 29/66* (2006.01)
*H01L 21/02* (2006.01)
*H01L 27/12* (2006.01)

(52) U.S. Cl.
CPC ...... *H01L29/4908* (2013.01); *H01L 29/66969* (2013.01); *H01L 29/78* (2013.01); *H01L 29/78618* (2013.01); H01L 21/02554 (2013.01); H01L 21/02565 (2013.01); H01L 21/02581 (2013.01); H01L 21/02631 (2013.01); H01L 27/1225 (2013.01)

(56) References Cited

U.S. PATENT DOCUMENTS

| | | |
|---|---|---|
| 5,851,861 A | 12/1998 | Suzawa et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,504,663 B2 | 3/2009 | Yamazaki et al. |
| 7,521,326 B2 | 4/2009 | Tanaka |
| 7,674,650 B2 | 3/2010 | Akimoto et al. |
| 7,705,358 B2 | 4/2010 | Okamoto et al. |
| 7,732,819 B2 | 6/2010 | Akimoto et al. |
| 8,008,140 B2 | 8/2011 | Yamaguchi et al. |
| 8,049,275 B2 | 11/2011 | Yamazaki |
| 8,274,077 B2 | 9/2012 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0099227 A1* | 4/2010 | Yamazaki et al. ............ 438/164 |
| 2010/0109002 A1 | 5/2010 | Itagaki et al. |
| 2011/0101334 A1 | 5/2011 | Yamazaki et al. |
| 2011/0133177 A1 | 6/2011 | Suzawa et al. |
| 2011/0147740 A1 | 6/2011 | Jeong et al. |
| 2011/0175087 A1 | 7/2011 | Yamazaki et al. |
| 2013/0087790 A1 | 4/2013 | Yamazaki |
| 2013/0092928 A1 | 4/2013 | Yamazaki |
| 2013/0092940 A1 | 4/2013 | Tezuka et al. |
| 2013/0119376 A1 | 5/2013 | Sasagawa et al. |
| 2014/0339552 A1* | 11/2014 | Sasagawa et al. ............... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2007-096055 A | 4/2007 |
| JP | 2007-123861 A | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, Vol, 39, pp. 621-624.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)_m$ (m=3, 4 and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW'02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors For High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID

(56) References Cited

OTHER PUBLICATIONS

Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al. "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Letts. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m <4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

* cited by examiner

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which transistors are formed using semiconductor thin films formed over a substrate having an insulation surface has been attracting attention. The transistor is applied to a wide range of semiconductor devices such as an integrated circuit (IC) and an image display device (also simply referred to as display device). A silicon-based semiconductor material is widely known as a material for a semiconductor thin film applicable to a transistor. As another material, an oxide semiconductor has been attracting attention.

For example, Patent Document 1 and Patent Document 2 disclose a technique in which a transistor is manufactured using zinc oxide or an In—Ga—Zn-based oxide as an oxide semiconductor and such a transistor is used as a switching element or the like of a pixel of a display device.

REFERENCE

Patent Document

[Patent Document 1] Japanese Published Patent Application No. 2007-123861
[Patent Document 2] Japanese Published Patent Application No. 2007-096055

SUMMARY OF THE INVENTION

In order to achieve high-speed operation, low power consumption, high integration, or the like of a transistor, it is necessary to miniaturize a transistor.

It is desirable to improve the on-state characteristics (e.g., on-state current and field-effect mobility) of the miniaturized transistor for high-speed response and high-speed driving of a semiconductor device. To suppress a decrease in on-state current of a transistor, it is effective to provide a gate electrode layer in a region (hereinafter, also referred to as a Lov region in this specification) where the gate electrode layer overlaps with a source electrode layer or a drain electrode layer with a gate insulating layer provided therebetween.

However, precise alignment between an oxide semiconductor layer with a narrow line width and a gate electrode layer with a narrow line width is required for formation of an Lov region, and the required accuracy thereof is increased in accordance with miniaturization of the transistor. Accordingly, it is concerned that yield of transistors in the manufacturing process is decreased due to miniaturization thereof.

Therefore, an object of an embodiment of the present invention is to provide a miniaturized semiconductor device with favorable characteristics maintained.

Another object of an embodiment of the present invention is to provide a miniaturized transistor having high electrical characteristics with high yield.

In an embodiment of the disclosed invention, in a transistor including an oxide semiconductor layer having a channel formation region and a pair of impurity regions between which the channel formation region is provided, a source electrode layer in contact with one side surface of the oxide semiconductor layer in the channel-length direction and a drain electrode layer in contact with the other side surface thereof are provided. The transistor further includes a gate electrode layer in a region overlapping with the channel formation region with a gate insulating layer provided therebetween, and a conductive layer having a function as part of the gate electrode layer in a region overlapping with the source electrode layer or the drain electrode layer with the gate insulating layer provided therebetween and in contact with a side surface of the gate electrode layer in the channel-length direction. With such a structure, an Lov region is formed with a scaled-down channel length maintained. The conductive layer provided in contact with the side surface of the gate electrode layer in the channel-length direction is formed as follows: a conductive film and an insulating layer which cover the gate electrode layer are formed, the insulating layer is processed into a sidewall insulating layer, and the conductive film is processed using the sidewall insulating layer as a mask. Accordingly, a scaled-down conductive layer in contact with the side surface of the gate electrode layer can be formed in a self-aligned manner. More specifically, any of the following structures can be employed, for example.

An embodiment of the present invention is a semiconductor device including a source electrode layer and a drain electrode layer; an oxide semiconductor layer which includes a first impurity region, a second impurity region, and a channel formation region sandwiched between the first impurity region and the second impurity region and which is in contact with the source electrode layer on a side surface of the first impurity region in the channel-length direction, and which is in contact with the drain electrode layer on a side surface of the second impurity region in the channel-length direction; a gate insulating layer in contact with upper surfaces of the oxide semiconductor layer, the source electrode layer, and the drain electrode layer; a gate electrode layer overlapping with the channel formation region with the gate insulating layer provided therebetween; a conductive layer which is in contact with a side surface of the gate electrode layer and at least part of which overlaps with the source electrode layer and the drain electrode layer in the channel-length direction with the gate insulating layer provided therebetween; and a sidewall insulating layer provided on a side surface of the conductive layer facing the gate electrode layer. A side edge of the conductive layer is aligned with a side edge of the sidewall insulating layer.

In the above semiconductor device, the thickness of the gate insulating layer in a region overlapping with the gate electrode layer may be greater than the thickness of the gate insulating layer in a region overlapping with the conductive layer.

In the above semiconductor device, the thickness of the gate insulating layer in the region overlapping with the conductive layer may be greater than the thickness of the gate insulating layer in a region overlapping neither with the conductive layer nor with the gate electrode layer.

Another embodiment of the present invention is a method for manufacturing a semiconductor device including the steps of: forming a source electrode layer and a drain electrode layer; forming an oxide semiconductor layer covering the source electrode layer and the drain electrode layer; removing the oxide semiconductor layer in a region overlapping with the source electrode layer and the drain electrode layer by a chemical mechanical polishing method, thereby forming an opening in the oxide semiconductor layer; processing the oxide semiconductor layer having the opening into an island-shaped oxide semiconductor layer provided between the source electrode layer and the drain electrode layer; forming a gate insulating layer over the oxide semiconductor layer, the source electrode layer, and the drain electrode layer; forming a gate electrode layer overlapping with the oxide semiconductor layer with the gate insulating layer provided therebetween; introducing an impurity into the oxide semiconductor layer using the gate electrode layer as a mask, thereby forming a first impurity region and a second impurity region in the oxide semiconductor layer in a self-aligned manner; forming a conductive film over the gate insulating layer and the gate electrode layer; forming an insulating layer over the conductive film; processing the insulating layer, thereby forming a sidewall insulating layer in contact with a side surface of the gate electrode layer with the conductive film provided therebetween; and etching the conductive film using the sidewall insulating layer as a mask, thereby forming a conductive layer in contact with the side surface of the gate electrode layer.

Another embodiment of the present invention is a method for manufacturing a semiconductor device including the steps of: forming an island-shaped oxide semiconductor layer; forming a first conductive film covering the oxide semiconductor layer; removing the first conductive film in a region overlapping with the oxide semiconductor layer by a chemical mechanical polishing method, thereby forming an opening in the first conductive film; processing the first conductive film having the opening, thereby forming a source electrode layer and a drain electrode layer; forming a gate insulating layer over the oxide semiconductor layer, the source electrode layer, and the drain electrode layer; forming a gate electrode layer overlapping with the oxide semiconductor layer with the gate insulating layer provided therebetween; introducing an impurity into the oxide semiconductor layer using the gate electrode layer as a mask, thereby forming a first impurity region and a second impurity region in the oxide semiconductor layer in a self-aligned manner; forming a second conductive film over the gate insulating layer and the gate electrode layer; forming an insulating layer over the second conductive film; processing the insulating layer, thereby forming a sidewall insulating layer in contact with a side surface of the gate electrode layer with the second conductive film provided therebetween; and etching the second conductive film using the sidewall insulating layer as a mask, thereby forming a conductive layer in contact with the side surface of the gate electrode layer.

Note that in this specification, "aligning with" includes "substantially aligning with". For example, a side surface of a layer A and a side surface of a layer B, which are included in a stacked structure and etched using the same mask, are considered to align with each other.

Note that the oxide semiconductor is in a single crystal state, a polycrystalline (also referred to as polycrystal) state, an amorphous state, or the like.

An oxide semiconductor in an amorphous state can have a flat surface with relative ease; therefore, when a transistor including the oxide semiconductor is operated, interface scattering of carriers (electrons) can be reduced, and relatively high field-effect mobility can be obtained with relative ease.

In an oxide semiconductor having crystallinity, defects in the bulk can be further reduced and when the surface flatness of the oxide semiconductor is improved, field-effect mobility of a transistor including the oxide semiconductor having crystallinity can be higher than that of a transistor including an oxide semiconductor in an amorphous state. In order to improve the surface flatness, the oxide semiconductor is preferably formed over a flat surface. Specifically, the oxide semiconductor can be formed over a surface with the average surface roughness (Ra) of less than or equal to 0.15 nm, preferably less than or equal to 0.1 nm.

Note that Ra is obtained by expanding arithmetic mean surface roughness, which is defined by JIS B0601: 2001 (ISO4287: 1997), into three dimensions so as to be applicable to a curved surface. In addition, Ra can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[FORMULA 1]}$$

Here, the designated surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the designated surface on the xy plane, and $Z_0$ represents the height of the reference surface (the average height of the specific surface). Ra can be measured using an atomic force microscope (AFM).

In a semiconductor device of an embodiment of the present invention, an impurity region is formed in an oxide semiconductor layer in a self-aligned manner using a gate electrode layer as a mask, and then, a conductive layer overlapping with a source electrode layer and a drain electrode layer is formed in contact with a side surface of the gate electrode layer in the channel-length direction. Thus, an Lov region can be provided while a scaled-down channel length is maintained, so that a miniaturized transistor in which a decrease in on-state current is suppressed can be provided.

Further, the conductive layer serving as part of the gate electrode layer is formed as follows: an insulating layer provided over the gate electrode layer with a conductive film provided therebetween is processed into a sidewall insulating layer in a self-aligned manner, and then, the conductive film is etched using the sidewall insulating layer as a mask. Since the conductive layer is formed without an etching step using a resist mask, precise processing can be accurately performed. Thus, in the manufacturing process of the semiconductor device, a miniaturized transistor having little variation in shapes and characteristics can be manufactured with high yield.

Accordingly, a miniaturized semiconductor device with favorable characteristics maintained can be provided according to an embodiment of the present invention.

DETAILED DESCRIPTION OF THE INVENTION

Figure 1A:
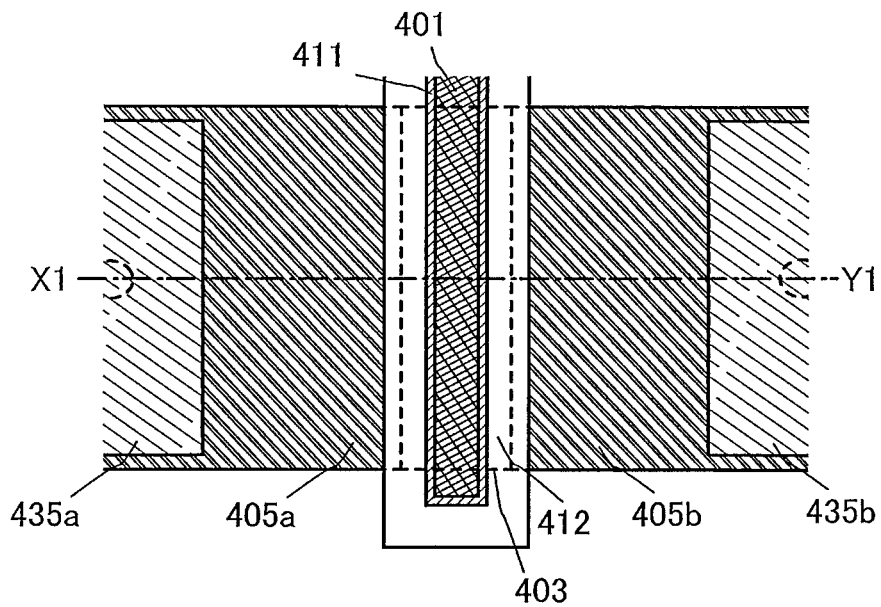
FIGS. 1A and 1B are a plan view and a cross-sectional view illustrating an embodiment of a semiconductor device.

Examples of embodiments of the present invention will be described below with reference to the drawings. Note that the present invention is not limited to the following description, and it will be easily understood by those skilled in the art that various changes and modifications can be made without departing from the spirit and scope of the invention. Therefore, the present invention should not be limited to the descriptions of the embodiments and the example below.

Note that in the following structures of an embodiment of the present invention, the same portions or portions having similar functions are denoted by common reference numerals in different drawings, and description thereof is not repeated. Further, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. In addition, the ordinal numbers in this specification do not denote particular names which specify the present invention.

(Embodiment 1)

In this embodiment, an embodiment of a semiconductor device and a method for manufacturing the semiconductor device are described with reference to FIGS. 1A and 1B, FIGS. 2A and 2B, FIGS. 3A to 3D, and FIGS. 4A to 4D.

Figure 1B:
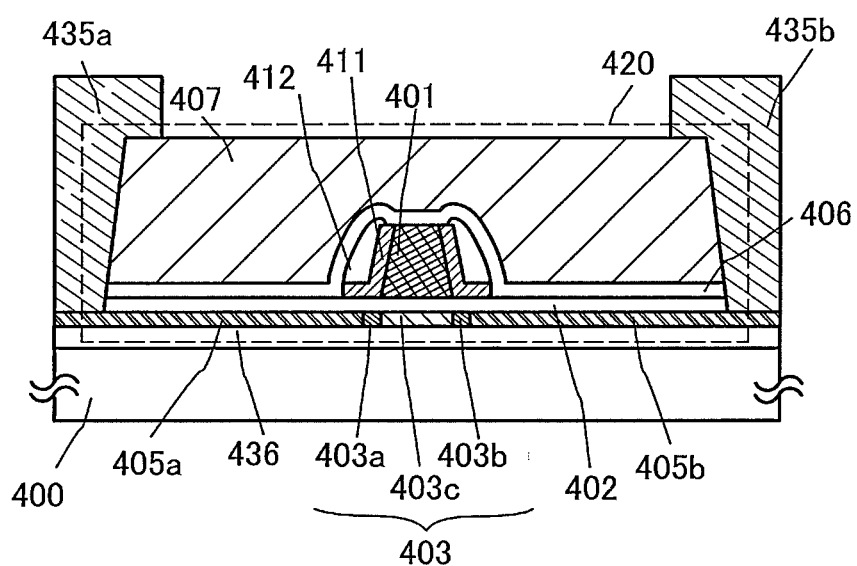

As an example of a semiconductor device, a plan view and a cross-sectional view of a transistor 420 are illustrated in FIGS. 1A and 1B, respectively. FIG. 1A is a plan view of the transistor 420, and FIG. 1B is a cross-sectional view taken along the line X1-Y1 in FIG. 1A. Note that in FIG. 1A, some components of the transistor 420 (e.g., an insulating layer 407 and the like) are not illustrated for simplicity.

The transistor 420 illustrated in FIGS. 1A and 1B includes, over a substrate 400 having an insulation surface, a base insulating layer 436; a source electrode layer 405a and a drain electrode layer 405b; an oxide semiconductor layer 403 including an impurity region 403a, an impurity region 403b, and a channel formation region 403c; a gate insulating layer 402 in contact with upper surfaces of the oxide semiconductor layer 403, the source electrode layer 405a, and the drain electrode layer 405b; a gate electrode layer 401 overlapping with the channel formation region 403c with the gate insulating layer 402 provided therebetween; a conductive layer 411 in contact with a side surface of the gate electrode layer 401; and a sidewall insulating layer 412 provided on a side surface of the conductive layer 411 facing the gate electrode layer 401.

The oxide semiconductor layer 403 is in contact with the source electrode layer 405a on a side surface of the impurity region 403a in the channel-length direction and in contact with the drain electrode layer 405b on a side surface of the impurity region 403b in the channel-length direction.

In the cross section of the transistor 420 in the channel-length direction, at least part of the conductive layer 411 is provided over the source electrode layer 405a and the drain electrode layer 405b with the gate insulating layer 402 provided therebetween. Since the conductive layer 411 is provided in contact with the side surface of the gate electrode layer 401 and can serve as part of the gate electrode layer 401, a region of the conductive layer 411 overlapping with the source electrode layer 405a or the drain electrode layer 405b with the gate insulating layer 402 provided therebetween in the cross section in the channel-length direction can be an Lov region.

In addition, the sidewall insulating layer 412 is provided in contact with part of the side surface of the conductive layer 411 facing the gate electrode layer 401. The conductive layer 411 is formed, in the manufacturing process, by processing a conductive film covering the gate electrode layer 401 using the sidewall insulating layer 412 as a mask. Accordingly, a side edge of the conductive layer 411 is aligned with a side edge of the sidewall insulating layer 412.

Note that when the length of the Lov region is large, parasitic capacitance caused in the region might be increased; however, in this embodiment, the length of the Lov region can be controlled by the length of the sidewall insulating layer 412 which is formed in a self-aligned manner on the side surface of the gate electrode layer 401 with the conductive layer 411 provided therebetween. Accordingly, a scaled-down Lov region can be processed with high accuracy.

In addition, the transistor 420 illustrated in FIGS. 1A and 1B may include, as its components, an insulating layer 406 and an insulating layer 407 provided over the sidewall insulating layer 412 and the gate electrode layer 401; and a wiring layer 435a and a wiring layer 435b provided over the insulating layer 407. The wiring layer 435a is electrically connected to the source electrode layer 405a through an opening provided in the insulating layer 406, the insulating layer 407, and the gate insulating layer 402. The wiring layer 435b is electrically connected to the drain electrode layer 405b through an opening provided in the insulating layer 406, the insulating layer 407, and the gate insulating layer 402.

The oxide semiconductor layer 403 includes the impurity region 403a and the impurity region 403b which are formed in a self-aligned manner by introduction of a dopant using the gate electrode layer 401 as a mask. These regions can serve as a source region and a drain region of the transistor 420 and have a resistance lower than the resistance of the channel formation region 403c. By providing the impurity region 403a and the impurity region 403b, electric field applied to the channel formation region 403c provided between the pair of impurity regions can be reduced. Further, the source electrode layer 405a and the drain electrode layer 405b are each in contact with the impurity region, whereby contact resistance between the oxide semiconductor layer 403 and the source and drain electrode layers 405a and 405b can be reduced.

When the length (in the channel-length direction) of the oxide semiconductor layer 403 is larger than the length (in the channel-length direction) of the gate electrode layer 401, the degree of freedom of alignment for forming the gate electrode layer 401 can be increased. Further, when the impurity region is provided in the oxide semiconductor layer 403, the channel length of the transistor 420 can be reduced. Thus, a miniaturized transistor can be manufactured with high yield.

A dopant contained in the impurity region 403a and the impurity region 403b is an impurity which changes the conductivity of the oxide semiconductor layer 403. As the dopant, one or more elements selected from a Group 15 elements (typically, phosphorus (P), arsenic (As), and antimony (Sb)), boron (B), aluminum (Al), nitrogen (N), argon (Ar), helium (He), neon (Ne), indium (In), titanium (Ti), and zinc (Zn) can be used. As the method for introducing the dopant, an ion implantation method, an ion doping method, a plasma immersion ion implantation method, or the like can be used.

The oxide semiconductor layer 403 is preferably a CAAC-OS (c-axis aligned crystalline oxide semiconductor) film.

The CAAC-OS film is not completely single crystal nor completely amorphous. The CAAC-OS film is an oxide semiconductor layer with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

Figure 2A:
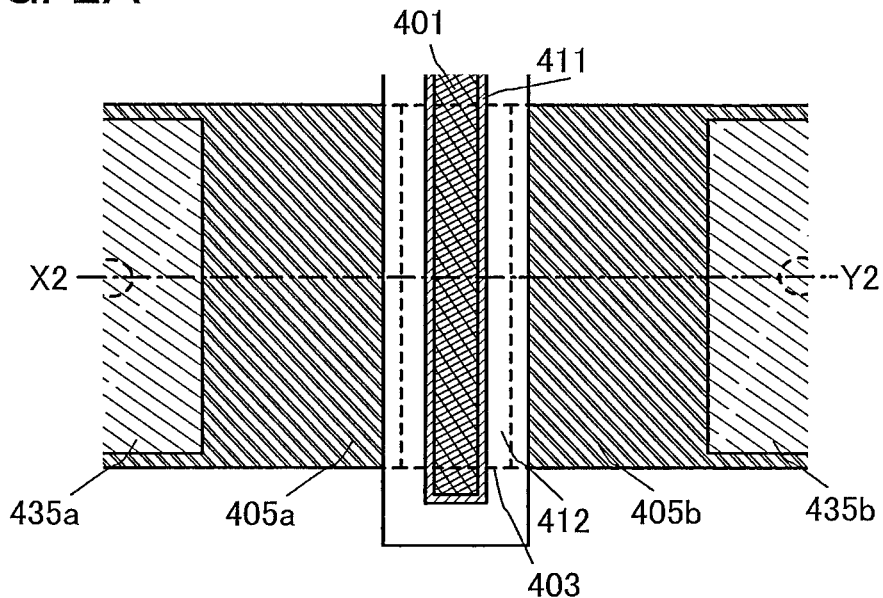
FIGS. 2A and 2B are a plan view and a cross-sectional view illustrating an embodiment of a semiconductor device.
Figure 2B:
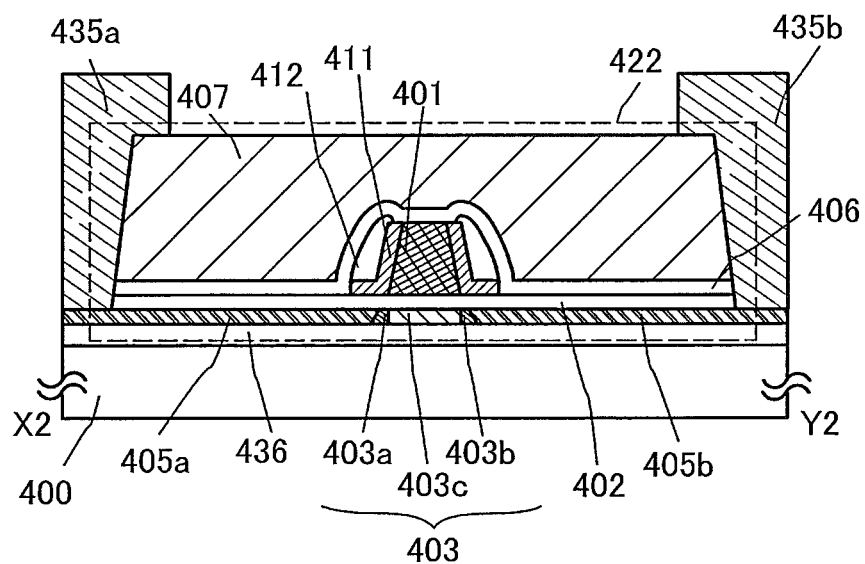

FIGS. 2A and 2B are a plan view and a cross-sectional view which illustrate a transistor 422 as another example of a semiconductor device according to this embodiment. FIG. 2A is a plan view of the transistor 422, and FIG. 2B is a cross-sectional view taken along the line X2-Y2 in FIG. 2A. Note that in FIG. 2A, some components of the transistor 422 (e.g., the insulating layer 407) are not illustrated for simplicity.

Like the transistor 420 illustrated in FIGS. 1A and 1B, the transistor 422 illustrated in FIGS. 2A and 2B includes, over the substrate 400 having an insulation surface, the base insulating layer 436; the source electrode layer 405a and the drain electrode layer 405b; the oxide semiconductor layer 403 including the impurity region 403a, the impurity region 403b, and the channel formation region 403c; the gate insulating layer 402 in contact with the upper surfaces of the oxide semiconductor layer 403, the source electrode layer 405a, and the drain electrode layer 405b; the gate electrode layer 401 overlapping with the channel formation region 403c with the gate insulating layer 402 provided therebetween; the conductive layer 411 in contact with the side surface of the gate electrode layer 401; and the sidewall insulating layer 412 provided on the side surface of the conductive layer 411 facing the gate electrode layer 401.

The oxide semiconductor layer 403 included in the transistor 422 illustrated in FIGS. 2A and 2B is different from the oxide semiconductor layer 403 in the transistor 420 illustrated in FIGS. 1A and 1B in that the side surface in contact with the source electrode layer 405a or the drain electrode layer 405b is tapered. A taper angle of the oxide semiconductor layer 403 in the transistor 422 can be greater than or equal to 20° and less than or equal to 50°, for example. Here, the taper angle refers to a tilt angle formed by the side surface and a bottom surface of a tapered layer (here, the oxide semiconductor layer 403) when the tapered layer is observed from a direction perpendicular to its cross section.

When the side surface of the oxide semiconductor layer 403 is tapered, contact area with the source electrode layer 405a or the drain electrode layer 405b can be increased and thus contact resistance can be further decreased.

In addition, in the case where the oxide semiconductor layer 403 is an oxide semiconductor with crystallinity, occurrence of oxygen deficiency which can be caused by elimination of oxygen from the side surface of the oxide semiconductor layer 403 can be suppressed owing to the tapered oxide semiconductor layer 403; thus, occurrence of leakage current in the transistor 422 can be reduced.

Hereinafter, a manufacturing process of the transistor of this embodiment will be described with reference to FIGS. 3A to 3D and FIGS. 4A to 4D. Note that a manufacturing method of the transistor 422 is described below as an example.

First, the base insulating layer 436 is formed over the substrate 400 having an insulation surface.

There is no particular limitation on a substrate that can be used as the substrate 400 having an insulation surface as long as it has at least heat resistance to withstand a subsequent heat treatment process. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or any of these substrates over which a semiconductor element is provided can be used as the substrate 400.

The semiconductor device may be manufactured using a flexible substrate as the substrate 400. In order to manufacture a flexible semiconductor device, the transistor 422 including the oxide semiconductor layer 403 may be directly formed over a flexible substrate. Alternatively, the transistor 422 including the oxide semiconductor layer 403 may be formed over a manufacturing substrate, and then, the transistor 422 may be separated from the manufacturing substrate and transferred to a flexible substrate. Note that in order to separate the transistor 422 from the manufacturing substrate and transfer it to the flexible substrate, a separation layer may be provided between the manufacturing substrate and the transistor 422 including the oxide semiconductor layer.

The base insulating layer 436 can have a single-layer or a layered structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials. Note that the base insulating layer 436 preferably has a single-layer structure or a layered structure including an oxide insulating film so that the oxide insulating film is in contact with the oxide semiconductor layer 403 formed later. Note that the base insulating layer 436 is not necessarily provided.

The base insulating layer 436 preferably includes a region where the oxygen content is higher than that in the stoichiometric composition (hereinafter also referred to as oxygen-excess region), in which case oxygen vacancies in the oxide semiconductor layer 403 formed later can be filled with the excess oxygen contained in the base insulating layer 436. In the case of having a layered structure, the base insulating layer 436 preferably includes an oxygen-excess region at least in a layer in contact with the oxide semiconductor layer 403. In order to provide the oxygen-excess region in the base insulating layer 436, for example, the base insulating layer 436 may be formed in an oxygen atmosphere. Alternatively, the oxygen-excess region may be formed by introducing oxygen (including at least one of an oxygen radical, an oxygen atom, and an oxygen ion) to the base insulating layer 436 after its formation. Oxygen can be introduced by an ion implantation method, an ion doping method, a plasma immersion ion implantation method, plasma treatment, or the like.

Figure 3A:
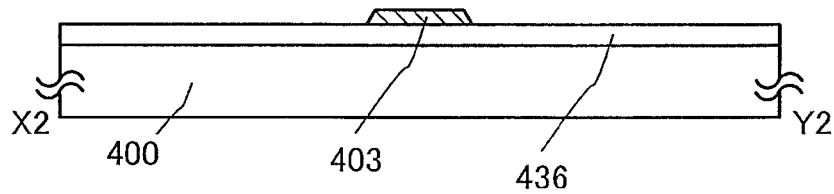
FIGS. 3A to 3D illustrate an example of a method for manufacturing a semiconductor device.

Next, an oxide semiconductor layer is deposited over the base insulating layer 436 and processed into an island shape to form the oxide semiconductor layer 403 (see FIG. 3A). The oxide semiconductor layer 403 has a thickness of, for example, 3 nm to 30 nm, preferably, 5 nm to 20 nm.

The oxide semiconductor layer may have either a single-layer structure or a layered structure. Further, the oxide semiconductor layer may have either an amorphous structure or a crystalline structure. In the case where the oxide semiconductor layer has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

As a method for forming the oxide semiconductor layer, a sputtering method, a molecular beam epitaxy (MBE) method, a chemical vapor deposition (CVD) method, a pulse laser deposition method, an atomic layer deposition (ALD) method, or the like can be used as appropriate. The oxide semiconductor layer may be formed with a sputtering apparatus which performs deposition in the state where surfaces of a plurality of substrates are substantially perpendicular to a sputtering target surface.

In the formation of the oxide semiconductor layer, the hydrogen concentration in the oxide semiconductor layer is preferably reduced as much as possible. In order to reduce the hydrogen concentration, for example, in the case where the oxide semiconductor layer is formed by a sputtering method, oxygen, a high-purity rare gas (typically, argon) from which impurities such as hydrogen, water, a hydroxyl group, and hydride have been removed, or a mixed gas of oxygen and the rare gas is used as appropriate as an atmosphere gas supplied to a process chamber of a sputtering apparatus.

The oxide semiconductor layer is formed in such a manner that a sputtering gas from which hydrogen and moisture are removed is introduced into a deposition chamber while moisture remaining in the deposition chamber is removed, whereby the concentration of hydrogen in the oxide semiconductor layer can be reduced. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. When the deposition chamber is evacuated with the cryopump, which has a high capability in removing a hydrogen molecule, a compound containing a hydrogen atom such as water ($H_2O$) (more preferably, also a compound containing a carbon atom), and the like, the impurity concentration in the oxide semiconductor layer formed in the deposition chamber can be reduced.

Further, when the oxide semiconductor layer is formed by a sputtering method, the relative density (filling rate) of a metal oxide target that is used for the deposition is greater than or equal to 90% and less than or equal to 100%, preferably greater than or equal to 95% and less than or equal to 99.9%. With the use of a metal oxide target with a high relative density, a dense oxide semiconductor layer can be deposited.

Further, to reduce the impurity concentration in the oxide semiconductor layer, it is also effective to form the oxide semiconductor layer while the substrate 400 is kept at high temperature. The temperature at which the substrate 400 is heated may be higher than or equal to 150° C. and lower than or equal to 450° C.; the substrate temperature is preferably higher than or equal to 200° C. and lower than or equal to 350° C. A crystalline oxide semiconductor layer can be formed by heating the substrate at a high temperature in the deposition.

An oxide semiconductor used for the oxide semiconductor layer 403 preferably contains at least indium (In) or zinc (Zn). In particular, both In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide; a tin oxide; a zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used as the oxide semiconductor depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

It is preferable to use a high-purity gas from which impurities such as hydrogen, water, a hydroxyl group, or hydride are removed as a sputtering gas used when the oxide semiconductor layer is formed.

There are three methods for obtaining a CAAC-OS film when the CAAC-OS film is used as the oxide semiconductor layer 403. The first method is to form an oxide semiconductor layer at a film formation temperature higher than or equal to 200° C. and lower than or equal to 450° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

Before the formation of the oxide semiconductor layer, planarization treatment may be performed on the surface on which the oxide semiconductor layer is to be formed. As the planarization treatment, polishing treatment (e.g., chemical mechanical polishing (CMP)), dry-etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to the substrate side with use of an RF power source in an argon atmosphere and plasma is generated in the vicinity of the substrate so that a substrate surface is modified. Note that instead of argon, nitrogen, helium, oxygen or the like may be used. The reverse sputtering can remove particle substances (also referred to as particles or dust) attached to the surface on which the oxide semiconductor layer is to be formed.

As the planarization treatment, polishing treatment, dry etching treatment, or plasma treatment may be performed plural times, or these treatments may be performed in combination. In the case where the treatments are combined, the order of steps may be set as appropriate, without particular limitation, depending on the unevenness of the surface on which the oxide semiconductor layer is to be formed.

Further, the oxide semiconductor layer 403 is preferably subjected to a heat treatment for removing excess hydrogen, including water and a hydroxyl group, (dehydration or dehydrogenation) contained in the oxide semiconductor layer 403. The temperature of the heat treatment is higher than or equal to 300° C. and lower than or equal to 700° C., or lower than the strain point of the substrate. The heat treatment can be performed in a reduced-pressure atmosphere, a nitrogen atmosphere, or the like.

Hydrogen, which is an impurity imparting n-type conductivity, can be removed from the oxide semiconductor by the heat treatment. For example, the hydrogen concentration in the oxide semiconductor layer 403 after the dehydration or dehydrogenation treatment can be lower than or equal to $5 \times 10^{19}/cm^3$, preferably lower than or equal to $5 \times 10^{18}/cm^3$.

Note that the heat treatment for dehydration or dehydrogenation may be performed at any timing in the process of manufacturing the transistor 422 as long as the heat treatment is performed after the formation of the oxide semiconductor layer. The heat treatment for the dehydration or dehydrogenation may be performed plural times, and may double as another heat treatment.

Note that in the case where the base insulating layer 436 contains oxygen, the heat treatment for the dehydration or dehydrogenation is preferably performed before the oxide semiconductor layer is processed into an island shape because oxygen contained in the base insulating layer 436 can be prevented from being released to an outside of the oxide semiconductor layer or the base insulating layer 436 by the heat treatment.

Note that in the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layer 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, further preferably 7N or more (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that is reduced by the step for removing an impurity for the dehydration or dehydrogenation, so that the oxide semiconductor layer 403 can be a highly-purified, i-type (intrinsic) oxide semiconductor layer.

Further or alternatively, oxygen (which includes at least one of an oxygen radical, an oxygen atom, and an oxygen ion) may be introduced to the oxide semiconductor layer after being subjected to the dehydration or dehydrogenation treatment to supply oxygen to the oxide semiconductor layer.

Introduction (supply) of oxygen into the dehydrated or dehydrogenated oxide semiconductor layer enables the oxide semiconductor layer to be highly purified and to be i-type (intrinsic). Variation in electric characteristics of a transistor having the highly-purified and electrically i-type (intrinsic) oxide semiconductor layer is suppressed, and the transistor is electrically stable.

In the step of introduction of oxygen to the oxide semiconductor layer, oxygen may be directly introduced to the oxide semiconductor layer 403 or may be introduced to the oxide semiconductor layer 403 through another film such as the gate insulating layer 402 or the insulating layer 406 to be formed later. An ion implantation method, an ion doping method, a plasma immersion ion implantation method, or the like may be employed for the introduction of oxygen through another film, whereas plasma treatment or the like can also be employed in addition to the above methods for the direct introduction of oxygen to the exposed oxide semiconductor layer 403.

The introduction of oxygen into the oxide semiconductor layer can be performed anytime after the formation of the oxide semiconductor layer. The step of introducing oxygen to the oxide semiconductor layer may be performed plural times.

Figure 3B:
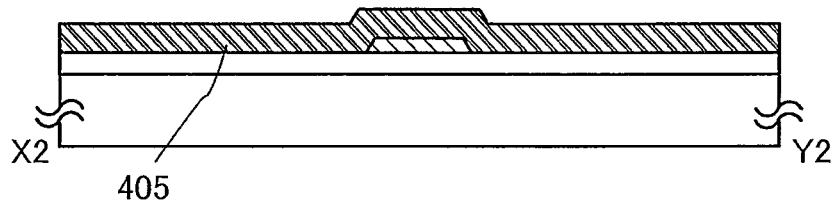

Next, a conductive film 405 which is to be a source electrode layer and a drain electrode layer (including a wiring formed using the same layer as the source electrode layer and the drain electrode layer) is formed over the oxide semiconductor layer 403 (see FIG. 3B).

The conductive film 405 is formed using a material that can withstand heat treatment in a later step. For example, a metal film containing an element selected from Al, Cr, Cu, Ta, Ti, Mo, and W, or a metal nitride film containing any of the above elements as a component (a titanium nitride film, a molybdenum nitride film, a tungsten nitride film, or a tantalum nitride film) can be used. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Alternatively, the conductive film 405 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials to which silicon oxide is added can be used.

Next, polishing (cutting or grinding) treatment is performed on the conductive film 405 to remove part of the conductive film 405 so that the oxide semiconductor layer 403 is exposed. By the polishing treatment, a region of the conductive film 405 overlapping with the oxide semiconductor layer 403 is removed and a conductive film having an opening in the region is thus formed. For the polishing (cutting or grinding) treatment, chemical mechanical polishing (CMP) treatment can be preferably used. In this embodiment, the region of the conductive film 405 which overlaps with the oxide semiconductor layer 403 is removed by the CMP treatment.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the flatness of the surfaces of the conductive film 405 and the oxide semiconductor layer 403 can be further increased.

Note that in this embodiment, the CMP treatment is used for removing the conductive film 405 in the region with which the oxide semiconductor layer 403 is overlapped; however, another polishing (grinding or cutting) treatment may be used. Alternatively, the polishing treatment such as the CMP treatment may be combined with etching (dry etching or wet etching) treatment or plasma treatment. For example, after the CMP treatment, dry etching treatment or plasma treatment (reverse sputtering or the like) may be performed to improve the planarity of the surface to be processed. In the case where the polishing treatment is combined with etching treatment, plasma treatment or the like, the order of the steps is not particularly limited, and may be set as appropriate depending on the material, thickness, and roughness of the surface of the conductive film 405.

Figure 3C:
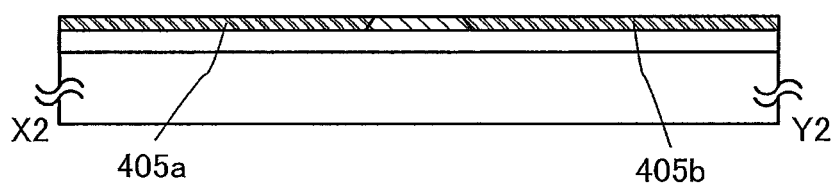

Next, selective etching treatment using a mask formed by a photolithography step is performed on the conductive film 405 having an opening where the oxide semiconductor layer 403 is exposed, thereby forming the source electrode layer 405a and the drain electrode layer 405b (including a wiring formed from the same layer as the source electrode layer and the drain electrode layer) (see FIG. 3C).

In the method described in this embodiment, the conductive film 405 is formed, the region of the conductive film 405 which overlaps with the oxide semiconductor layer 403 is removed by polishing treatment, and then selective etching is performed, so that the source electrode layer 405a and the drain electrode layer 405b are formed; however, an embodiment of the present invention is not limited to this method. The source electrode layer 405a and the drain electrode layer 405b may be formed by such a method that the conductive film 405 is deposited and processed by selective etching and then the region of the conductive film 405 overlapping with the oxide semiconductor layer 403 is removed by polishing treatment.

When the source electrode layer 405a and the drain electrode layer 405b are formed in the method for manufacturing the transistor described in this embodiment, etching treatment using a resist mask is not used in the step of removing the region of the conductive film 405 which overlaps with the oxide semiconductor layer 403; thus, precise processing can be accurately performed even in the case where the length of the oxide semiconductor layer 403 is scaled down. Thus, in the manufacturing process of the semiconductor device, the transistor 422 having little variation in shapes and characteristics and a miniaturized structure can be manufactured with high yield.

Note that in this embodiment, the tops of the source electrode layer 405a and the drain electrode layer 405b are substantially aligned with the top of the oxide semiconductor layer 403. Note that the shape of the source electrode layer 405a and the drain electrode layer 405b differs depending on the conditions of polishing treatment for removing part of the conductive film 405. For example, in some cases, the thickness of the source electrode layer 405a or the drain electrode layer 405b may be smaller than the thickness of the oxide semiconductor layer 403.

Next, the gate insulating layer 402 is formed over the oxide semiconductor layer 403, the source electrode layer 405a, and the drain electrode layer 405b.

The gate insulating layer 402 can be formed to have a thickness greater than or equal to 1 nm and less than or equal to 20 nm by a sputtering method, an MBE method, a CVD method, a pulse laser deposition method, an ALD method, or the like as appropriate. The gate insulating layer 402 may be deposited with a sputtering apparatus which performs deposition in the state where surfaces of a plurality of substrates are substantially perpendicular to a sputtering target surface.

As the thickness of the gate insulating layer 402 is larger, a short channel effect is enhanced more and the threshold voltage tends to shift more in the negative side. However, in the method for manufacturing the transistor of this embodiment, the upper surfaces of the source electrode layer 405a, the drain electrode layer 405b, and the oxide semiconductor layer 403 are planarized by the polishing treatment; thus, the gate insulating layer 402 with a small thickness can be formed with good coverage.

The gate insulating layer 402 can be formed using a silicon oxide, a gallium oxide, an aluminum oxide, a silicon nitride, a silicon oxynitride, an aluminum oxynitride, a silicon nitride oxide, or the like. It is preferable that the gate insulating layer 402 include oxygen in a portion which is in contact with the oxide semiconductor layer 403. In particular, it is preferable that the oxygen content of the gate insulating layer 402 in (a bulk of) the film be in excess of that in the stoichiometric composition. For example, in the case where a silicon oxide film is used as the gate insulating layer 402, the composition formula thereof is preferably $SiO_{2+\alpha}$, ($\alpha>0$). In this embodiment, a silicon oxide film of $SiO_{2+\alpha}$, ($\alpha>0$) is used as the gate insulating layer 402. By using the silicon oxide film as the gate insulating layer 402, oxygen can be supplied to the oxide semiconductor layer 403, leading to favorable characteristics.

When the gate insulating layer 402 is formed using a high-k material such as hafnium oxide, yttrium oxide, hafnium silicate, hafnium silicate to which nitrogen is added, hafnium aluminate, or lanthanum oxide, gate leakage current can be reduced. Further, the gate insulating layer 402 may have either a single-layer structure or a layered structure.

Further, as in the base insulating layer 436, the gate insulating layer 402 preferably includes an oxygen-excess region because an oxygen vacancy in the oxide semiconductor layer 403 can be compensated by excess oxygen contained in the gate insulating layer 402. In the case where the gate insulating layer 402 has a layered structure, the gate insulating layer 402 preferably includes an oxygen-excess region at least in a layer in contact with the oxide semiconductor layer 403. In order to provide the oxygen-excess region in the gate insulating layer 402, for example, the gate insulating layer 402 may be formed in an oxygen atmosphere. Alternatively, the oxygen-excess region may be formed by introducing oxygen (including at least one of an oxygen radical, an oxygen atom, and an oxygen ion) into the gate insulating layer 402 after its formation. Oxygen can be introduced by an ion implantation method, an ion doping method, a plasma immersion ion implantation method, plasma treatment, or the like.

Note that in the case where oxygen is introduced into the formed gate insulating layer 402, oxygen may be introduced into the oxide semiconductor layer 403 by the oxygen introduction treatment. Heat treatment is preferably performed after oxygen is introduced into the gate insulating layer 402. The heat treatment is performed at a temperature, for example, higher than or equal to 300° C. and lower than or equal to 450° C. Note that the heat treatment can also serve as dehydration treatment or dehydrogenation treatment on the oxide semiconductor layer 403.

Note that the introduction of oxygen into the gate insulating layer 402 can be performed anytime after the formation of the gate insulating layer 402. A plurality of oxygen introduction methods can be used in combination. For example, oxygen may be introduced by an ion implantation method and plasma treatment after the formation of the gate insulating layer 402 and heat treatment may be performed. Alternatively, it is possible to introduce oxygen by plasma treatment after the formation of the gate insulating layer 402, introduce oxygen again by an ion implantation method in a later step after formation of the insulating layer 406, and perform heat treatment; the order of plasma treatment and ion implantation treatment may be changed.

Next, the gate electrode layer 401 is formed over the island-shaped oxide semiconductor layer 403 with the gate insulating layer 402 provided therebetween. The gate electrode layer 401 can be formed by a plasma-enhanced CVD method, a sputtering method, or the like. Further, as a material of the gate electrode layer 401, a metal film containing an element selected from molybdenum, titanium, tantalum, tungsten, aluminum, copper, chromium, neodymium, or scandium; a metal nitride film containing any of the above elements as its component (e.g., a titanium nitride film, a molybdenum nitride film, or a tungsten nitride film); or the like can be used. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a layered structure.

The gate electrode layer 401 can be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a layered structure of the above conductive material and the above metal material.

As one layer of the gate electrode layer 401 which is in contact with the gate insulating layer 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function higher than or equal to 5 eV (electron volt), preferably higher than or equal to 5.5 eV, and when this film is used as the gate electrode layer, the threshold voltage of a transistor can be shifted to the positive side; accordingly, a normally-off switching element can be provided.

Note that the gate electrode layer 401 can be formed by processing a conductive film (not illustrated) provided over the gate insulating layer 402 using a mask. Here, as the mask used for processing, a mask having a finer pattern which is formed by performing a slimming process on a mask formed by a photolithography method or the like is preferably used.

As the slimming process, an ashing process in which oxygen in a radical state (an oxygen radical) or the like is used can be employed, for example. However, the slimming process is not limited to the ashing process as long as the mask formed by a photolithography method or the like can be processed into a finer pattern. Note that the channel length (L) of a transistor is determined by the mask formed by the slimming process. Therefore, it can be preferable to employ a process with high controllability as the slimming process.

As a result of the slimming process, the line width of the mask formed by a photolithography method or the like can be scaled down to a length shorter than or equal to the resolution limit of a light exposure apparatus, preferably less than or equal to half of the resolution limit of a light exposure apparatus, more preferably less than or equal to one third of the resolution limit of the light exposure apparatus. For example, the line width can become greater than or equal to 30 nm and less than or equal to 2000 nm, preferably greater than or equal to 50 nm and less than or equal to 350 nm. This enables further miniaturization of the transistor.

Next, a dopant 431 is introduced into the oxide semiconductor layer 403 using the gate electrode layer 401 as a mask, whereby the impurity regions 403a and 403b are formed. The oxide semiconductor layer 403 in which the pair of impurity regions is formed with the channel formation region 403c provided therebetween is formed by the introduction of the dopant 431 (see FIG. 3D).

The dopant 431 can be introduced by an ion implantation method, an ion doping method, a plasma immersion ion implantation method, or the like. In the case where the above method is used, it is preferable to use a single ion, a fluoride ion, or a chloride ion of the dopant 431.

The introduction of the dopant 431 may be controlled by setting the addition conditions such as the acceleration voltage and the dosage, or the thickness of the films through which the dopant passes as appropriate. The dosage of the dopant 431 is preferably set to be greater than or equal to $1\times10^{13}$ ions/cm$^2$ and less than or equal to $5\times10^{16}$ ions/cm$^2$, for example. The concentration of the dopant 431 in the impurity region is preferably greater than or equal to $5\times10^{18}$/cm$^3$ and less than or equal to $1\times10^{22}$/cm$^3$.

The dopant 431 may be introduced while the substrate 400 is heated.

The introduction of the dopant 431 to the oxide semiconductor layer 403 may be performed a plurality of times, and a plurality of kinds of dopant may be used.

Further, heat treatment may be performed thereon after the introduction of the dopant 431. The heat treatment is preferably performed at a temperature higher than or equal to 300° C. and lower than or equal to 700° C., preferably higher than or equal to 300° C. and lower than or equal to 450° C. for one hour under an oxygen atmosphere. The heat treatment may be performed under a nitrogen atmosphere, reduced pressure, or the air (ultra-dry air).

When the oxide semiconductor layer 403 is a CAAC-OS film, the oxide semiconductor layer 403 is partly amorphized by introduction of the dopant 431 in some cases. In that case, the crystallinity of the oxide semiconductor layer 403 can be recovered by performing heat treatment thereon after the introduction of the dopant 431.

Figure 3D:
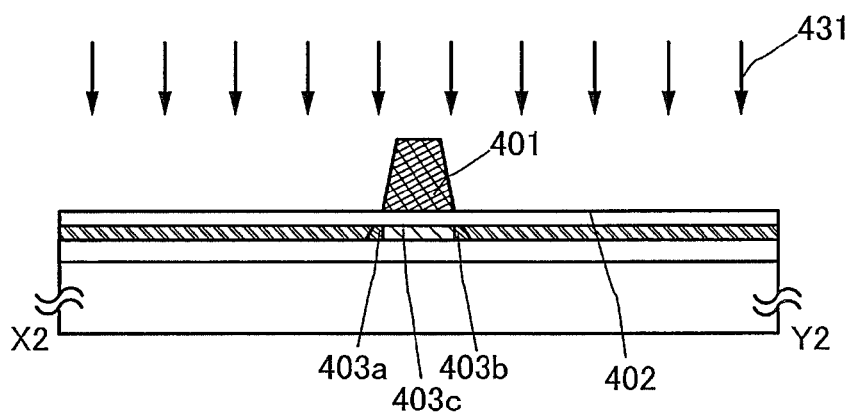

Note that since the oxide semiconductor layer 403 is tapered in FIG. 3D, the edge of the oxide semiconductor layer 403 overlaps with the source electrode layer 405a or the drain electrode layer 405b. In some cases, the dopant 431 is difficult to be introduced into this overlapping region depending on the introduction conditions of the dopant 431; thus, the dopant concentration may be ununiformly distributed in the film-thickness direction of the impurity region 403a or 403b.

Figure 4A:
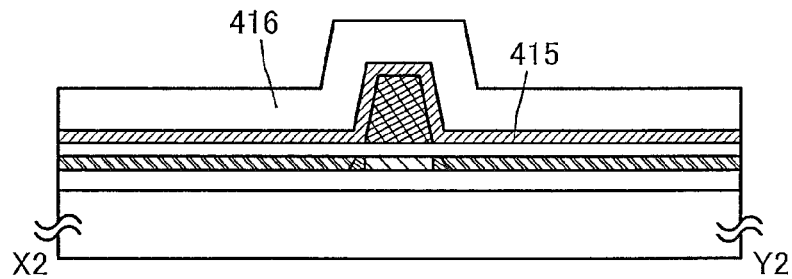
FIGS. 4A to 4D illustrate an example of a method for manufacturing a semiconductor device.

Next, the conductive film 415 is formed over the gate electrode layer 401 and the gate insulating layer 402, and an insulating layer 416 is formed over the conductive film 415 (see FIG. 4A).

The conductive film 415 can be formed using a material similar to that of the gate electrode layer 401 and is preferably deposited by a sputtering method. The thickness of the conductive film 415 is preferably greater than or equal to 10 nm and less than or equal to 50 nm, for example.

The insulating layer 416 can be formed using silicon oxide, silicon nitride, silicon oxynitride, silicon nitride oxide, or the like, and is preferably deposited by a CVD method.

In general, step coverage is poor in the case of a sputtering method as compared to the case of a CVD method. Thus, in the case of forming a conductive layer in contact with a sidewall of the gate electrode layer 401 in a self-aligned manner, in such a manner that a conductive film having a large thickness and in contact with the gate electrode layer 401 is formed and is subjected to anisotropic etching, a step (a boundary between the region in contact with the gate insulating layer 402 and the region in contact with the gate electrode layer 401) may have a low-density portion, in some cases. When the conductive layer serving as part of the gate electrode layer has a low-density portion, the portion can cause occurrence of leakage current.

However, in this embodiment, the conductive film 415 having a small thickness is formed to cover the gate electrode layer 401, and then, the insulating layer 416 in contact with the conductive film 415 is formed by a CVD method by which good step coverage is obtained. Thus, the gate electrode layer 401 can be covered by the conductive film 415 with good film quality.

Although the gate electrode layer 401 is tapered in this embodiment, an embodiment of the present invention is not limited thereto. Note that it is preferable that the gate electrode layer 401 be tapered because the conductive film 415 can be easily formed with good step coverage.

Figure 4B:
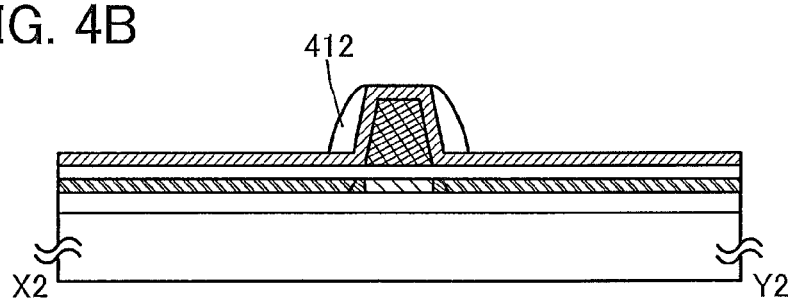

Next, the sidewall insulating layer 412 is formed by anisotropically etching the insulating layer 416 (see FIG. 4B).

Figure 4C:
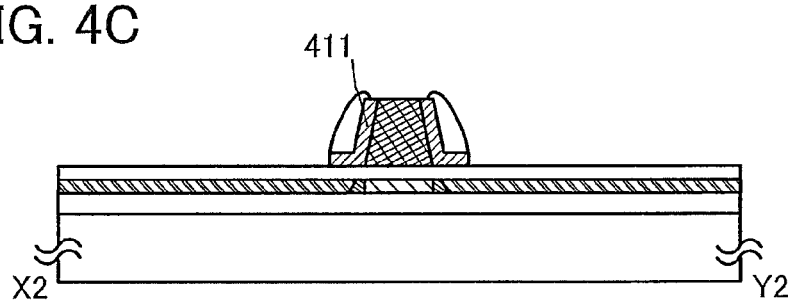

Next, the conductive film 415 is etched using the sidewall insulating layer 412 as a mask to form the conductive layer 411 which is in contact with the side surface (in the channel-length direction) of the gate electrode layer 401 (see FIG. 4C).

Then, the insulating layer 406 and the insulating layer 407 are formed over the gate insulating layer 402, the gate electrode layer 401, and the sidewall insulating layer 412. Note that in this embodiment, a stack of the insulating layer 406 and the insulating layer 407 is provided over the gate insulating layer 402, the gate electrode layer 401, and the sidewall insulating layer 412; an embodiment of the present invention is not limited thereto. An insulating layer having a single-layer structure may be provided. Alternatively, three or more insulating layers may be stacked.

The insulating layer 406 or the insulating layer 407 can be formed by a plasma-enhanced CVD method, a sputtering method, an evaporation method, or the like. Specifically, the insulating layer 406 or the insulating layer 407 is preferably formed by a method such as a sputtering method, in which an impurity such as water or hydrogen does not enter the insulating layer 406 or the insulating layer 407. As the insulating layer 406 or the insulating layer 407, an inorganic insulating film such as a silicon oxide film, a silicon oxynitride film, an aluminum oxynitride film, or a gallium oxide film, or the like can be typically used.

As the insulating layer 406 or the insulating layer 407, an aluminum oxide film, a hafnium oxide film, a magnesium oxide film, a zirconium oxide film, a lanthanum oxide film, a barium oxide film, or a metal nitride film (e.g., an aluminum nitride film) can be used.

Note that an aluminum oxide film is preferably provided as the insulating layer 406 or the insulating layer 407. The aluminum oxide film can be preferably used because it has a high shielding effect (blocking effect), which is impermeable to either or both oxygen and impurities such as hydrogen and moisture, and, in and after the manufacturing process, the aluminum oxide film functions as a protective film for preventing entry of an impurity such as hydrogen and moisture, which cause a change in operation characteristics of a transistor, into the oxide semiconductor layer 403 and release of oxygen, which is a main constituent material of the oxide semiconductor, from the oxide semiconductor layer 403.

In order to remove residual moisture from the deposition chamber for depositing the insulating layer 406 and the insulating layer 407 in a manner similar to that of the deposition of the oxide semiconductor layer 403, an entrapment vacuum pump (such as a cryopump) is preferably used. When the insulating layer 406 or the insulating layer 407 is deposited in the deposition chamber evacuated using a cryopump, the impurity concentration of the insulating layer 406 or the insulating layer 407 can be reduced. As an exhaustion unit for removing moisture remaining in the deposition chamber for depositing the insulating layer 406 or the insulating layer 407, a turbo molecular pump provided with a cold trap may also be used.

In this embodiment, an aluminum oxide film is formed as the insulating layer 406 and a silicon oxide film is formed as the insulating layer 407. Note that the aluminum oxide film has a high density (film density higher than or equal to 3.2 g/cm$^3$, preferably higher than or equal to 3.6 g/cm$^3$), whereby the transistor 422 can have stable electrical characteristics. The film density can be measured by Rutherford backscattering spectrometry (RBS) or X-ray reflection (XRR).

In the case where an aluminum oxide film is formed as the insulating layer 406, heat treatment is preferably performed after the aluminum oxide film is formed. An aluminum oxide film has a function of preventing entry of water (and/or hydrogen) into an oxide semiconductor layer and a function of preventing oxygen detachment from an oxide semiconductor layer. Thus, when the oxide semiconductor layer 403 and/or the insulating layer in contact therewith include(s) at least one oxygen-excess region can be provided in the film (bulk) or the interface between the insulating layer and the oxide semiconductor layer by performing heat treatment in a state where the aluminum oxide film is provided.

Figure 4D:
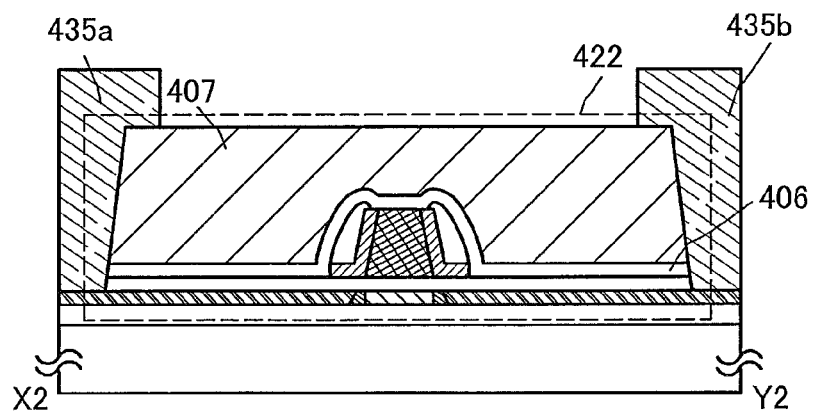

Next, openings reaching the source electrode layer 405a or the drain electrode layer 405b are formed in the insulating layer 407, the insulating layer 406, and the gate insulating layer 402, and the wiring layer 435a and the wiring layer 435b are formed in the openings (see FIG. 4D). With the use of the wiring layers 435a and 435b, the transistor is connected to another transistor or another element, which can lead to formation of a variety of circuits.

The wiring layers 435a and 435b can be formed using a material and a method similar to those of the gate electrode layer 401, the conductive layer 411, the source electrode layer 405a, or the drain electrode layer 405b. For example, a metal film containing an element selected from Al, Cr, Cu, Ta, Ti, Mo, and W, a metal nitride film containing any of the above elements as a component (e.g., a titanium nitride film, a molybdenum nitride film, or a tungsten nitride film), or the like can be used. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. The wiring layers 435a and 435b may be formed using conductive metal oxide. Indium oxide (In$_2$O$_3$), tin oxide (SnO$_2$), zinc oxide (ZnO), an indium oxide-tin oxide (ITO), indium oxide-zinc oxide (In$_2$O$_3$—ZnO), or any of these metal oxide materials containing silicon oxide can be used as the conductive metal oxide.

For example, as the wiring layers 435a and 435b, a single layer of molybdenum film, a stack of a tantalum nitride film and a copper film, or a stack of a tantalum nitride film and a tungsten film can be used.

Through the above-described process, the transistor 422 of this embodiment can be formed.

The transistor described in this embodiment includes the oxide semiconductor layer 403 including the pair of impurity regions and the channel formation region, and the source electrode layer 405a and the drain electrode layer 405b in contact with the side surface (in the channel-length direction) of the impurity regions in the oxide semiconductor layer 403. Accordingly, contact resistance between the oxide semiconductor layer 403 and the source and drain electrode layers 405a and 405b can be reduced, and on-state characteristics (e.g., on-state current and field-effect mobility), operation speed, and response speed of the transistor can be increased.

In addition, since a dopant is introduced using the gate electrode layer 401 as a mask, the length of the channel formation region 403c can be reduced while the length (in the channel-length direction) of the island-shaped oxide semiconductor layer 403 is maintained to such a level that the alignment accuracy of the gate electrode layer 401 can be maintained. Accordingly, the miniaturized transistor 422 can be provided with high yield.

Further, in the step of removing the oxide semiconductor layer 413 in the region overlapping with the source electrode layer 405a and the drain electrode layer 405b, etching treatment using a resist mask is not performed, so that precise processing can be accurately performed even in the case where the distance between the source electrode layer 405a and the drain electrode layer 405b is scaled down. Thus, in the manufacturing process of the semiconductor device, the miniaturized transistor having little variation in shapes and characteristics can be manufactured with high yield.

Further, the semiconductor device in this embodiment includes the conductive layer 411 on the side surface of the gate electrode layer 401; thus, the conductive layer 411 overlaps with the source electrode layer 405a and the drain electrode layer 405b with the gate insulating layer 402 provided therebetween. Accordingly, it is possible that the transistor has an Lov region and a decrease in the on-state current of the transistor is suppressed.

Further, in the manufacturing process, the conductive layer 411 is formed without an etching step using a resist mask: the insulating layer 416 provided over the gate electrode layer 401 with the conductive film 415 provided therebetween is processed into the sidewall insulating layer 412 in a self-aligned manner by anisotropic etching, and then, the conductive film 415 is etched using the sidewall insulating layer 412 as a mask. Accordingly, precise processing can be accurately performed. Thus, in the manufacturing process of the semiconductor device, the miniaturized transistor having little variation in shapes and characteristics can be manufactured with high yield.

As described above, according to an embodiment of the disclosed invention, a problem due to miniaturization can be resolved. As a result, the size of the transistor can be sufficiently reduced. When the size of the transistor is sufficiently reduced, the size of the semiconductor device is also reduced and thus the number of semiconductor devices manufactured on one substrate is increased. Accordingly, manufacturing costs of the semiconductor device can be reduced. Furthermore, effects of high-speed operation, low power consumption, and the like of a transistor can be obtained in accordance with a reduction in channel length. Thus, miniaturization of a transistor including an oxide semiconductor can be achieved according to an embodiment of the disclosed invention, and various effects accompanied with the miniaturization can be obtained.

The methods and structures described in this embodiment can be combined as appropriate with any of the methods and structures described in the other embodiments.

(Embodiment 2)

In this embodiment, a structure and a manufacturing method of a semiconductor device according to an embodiment of the disclosed invention, which are different from those of Embodiment 1, will be described with reference to FIGS. 5A and 5B, FIGS. 6A to 6D, and FIGS. 7A to 7C. The same portions as those in Embodiment 1 and portions having functions similar to those in Embodiment 1 and the same steps as those in Embodiment 1 and steps similar to those in Embodiment 1 can be conducted as in Embodiment 1, and repeated description is skipped. In addition, detailed description of the same portion is skipped.

Figure 5A:
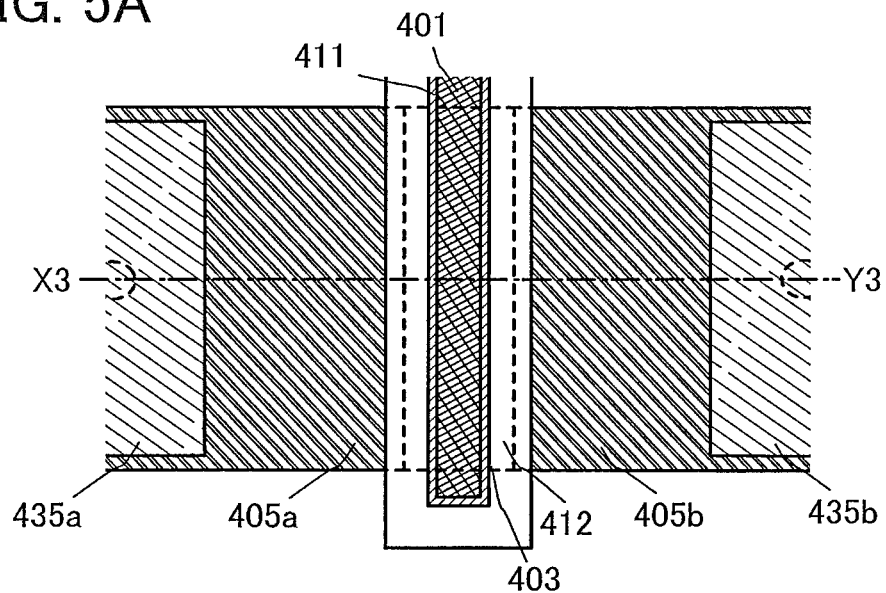
FIGS. 5A and 5B are a plan view and a cross-sectional view illustrating an embodiment of a semiconductor device.
Figure 5B:
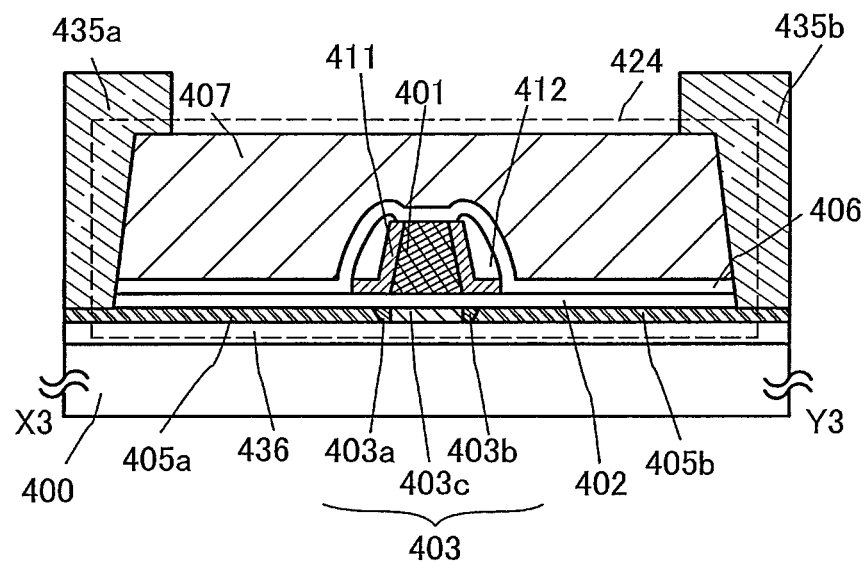

FIGS. 5A and 5B are respectively a plan view and a cross-sectional view which illustrate a transistor 424 as another example of a semiconductor device. FIG. 5A is a plan view of the transistor 424, and FIG. 5B is a cross-sectional view taken along line X3-Y3 in FIG. 5A. Note that in FIG. 5A, some components of the transistor 424 (e.g., an insulating layer 407) are not illustrated for simplicity.

Like the transistor 420 illustrated in FIGS. 1A and 1B, the transistor 424 illustrated in FIGS. 5A and 5B includes, over the substrate 400 having an insulation surface, the base insulating layer 436; the source electrode layer 405a and the drain electrode layer 405b; the oxide semiconductor layer 403 including the impurity region 403a, the impurity region 403b, and the channel formation region 403c; the gate insulating layer 402 in contact with the upper surfaces of the oxide semiconductor layer 403, the source electrode layer 405a, and the drain electrode layer 405b; the gate electrode layer 401 overlapping with the channel formation region 403c with the gate insulating layer 402 provided therebetween; the conductive layer 411 in contact with the side surface of the gate electrode layer 401; and the sidewall insulating layer 412 provided on the side surface of the conductive layer 411 facing the gate electrode layer 401.

The source electrode layer 405a and the drain electrode layer 405b included in the transistor 424 illustrated in FIGS. 5A and 5B are different from those in the transistor described in Embodiment 1 in that the side surfaces in contact with the oxide semiconductor layer 403 are tapered. In the transistor 424, each tapered angle of the source electrode layer 405a and the drain electrode layer 405b can be greater than or equal to 20° and less than or equal to 50°, for example.

When the side surfaces of the source electrode layer 405a and the drain electrode layer 405b are tapered, an oxide semiconductor layer to be the oxide semiconductor layer 403 can be formed with good coverage between the source electrode layer 405a and the drain electrode layer 405b. Further, since contact area with the oxide semiconductor layer 403 can be increased, contact resistance can be reduced.

Further, since the source electrode layer 405a and the drain electrode layer 405b are tapered, the oxide semiconductor layer 403 which is provided in contact with the source electrode layer 405a and the drain electrode layer 405b is inversely tapered on the side surfaces in the channel-length direction. Here, in the case where the oxide semiconductor layer 403 is an oxide semiconductor having crystallinity, oxygen deficiency which can be caused by elimination of oxygen from the side surface of the oxide semiconductor layer 403 is suppressed owing to the tapered oxide semiconductor layer 403; thus, leakage current in the transistor 424 can be reduced.

When the oxide semiconductor layer 403 has an inverse tapered shape, the length (in the channel-length direction) of the upper surface of the oxide semiconductor layer 403 in contact with the gate insulating layer 402 can be increased. Accordingly, the degree of freedom in alignment in formation of the gate electrode layer 401 over the oxide semiconductor layer 403 with the gate insulating layer 402 provided therebetween can be increased. Moreover, the electric field between the source electrode layer 405a and the drain electrode layer 405b can be effectively reduced.

Hereinafter, a manufacturing process of the transistor 424 according to this embodiment will be described with reference to FIGS. 6A to 6D.

First, the base insulating layer 436 is formed over the substrate 400 having an insulation surface. A conductive film for forming a source electrode layer and a drain electrode layer (including a wiring formed from the same layer as the source electrode layer and the drain electrode layer) is formed over the base insulating layer 436 and is processed to form the source electrode layer 405a and the drain electrode layer 405b (see FIG. 6A).

Figure 6A:
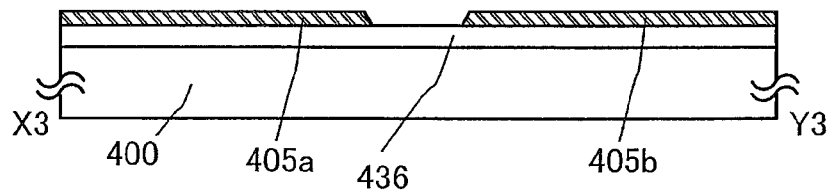
FIGS. 6A to 6D illustrate an example of a method for manufacturing a semiconductor device.
Figure 6B:
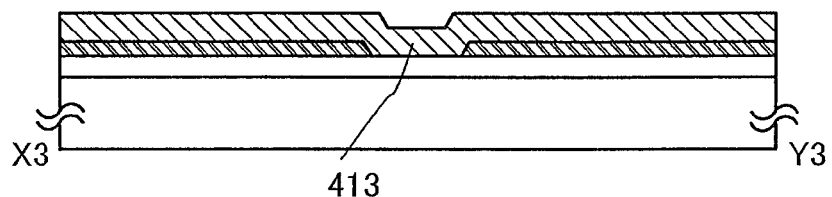

Then, the oxide semiconductor layer 413 covering the source electrode layer 405a and the drain electrode layer 405b and in contact with the base insulating layer 436 is formed (see FIG. 6B). The oxide semiconductor layer 413 can be formed in a manner similar to that of the oxide semiconductor layer described in Embodiment 1.

Then, polishing (cutting or grinding) treatment is performed on the oxide semiconductor layer 413 to remove part of the oxide semiconductor layer 413 and expose the source electrode layer 405a and the drain electrode layer 405b. By the polishing treatment, the regions of the oxide semiconductor layer 413 overlapping with the source electrode layer 405a and the drain electrode layer 405b are removed and openings are formed in the regions. CMP treatment is preferably used as the polishing method. In this embodiment, the regions of the oxide semiconductor layer 413 overlapping with the source electrode layer 405a and the drain electrode layer 405b are removed by CMP treatment. Note that the CMP treatment may be performed only once or plural times.

Although the regions of the oxide semiconductor layer 413 which overlap with the source electrode layer 405a and the drain electrode layer 405b are removed by the CMP treatment in this embodiment, another polishing treatment may be used. Alternatively, the polishing treatment such as the CMP treatment may be combined with etching (dry etching or wet etching) treatment or plasma treatment.

Figure 6C:
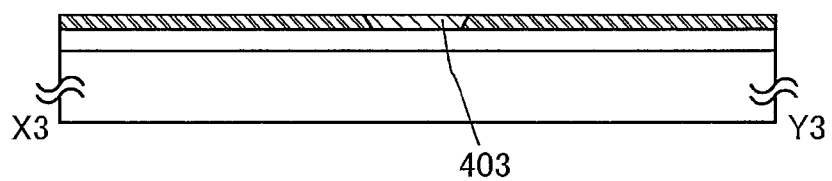
Figure 6D:
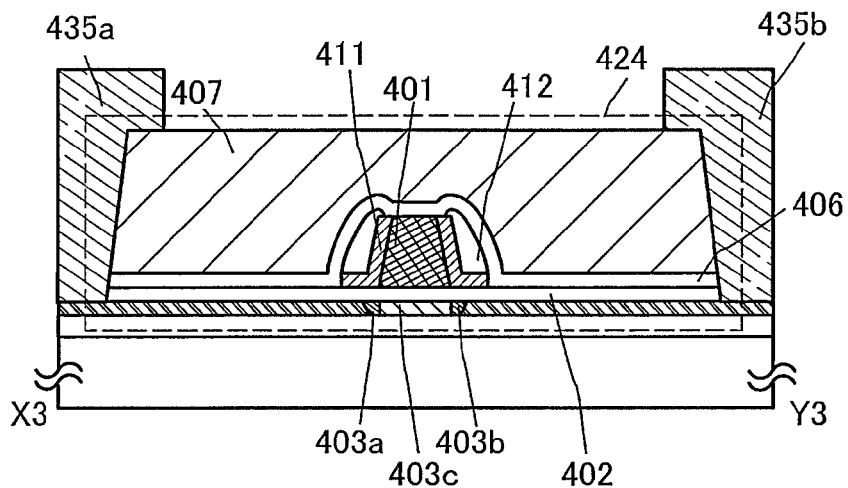

Next, selective etching treatment in the channel-width direction is performed on the oxide semiconductor layer 413 from which the regions overlapping with the source electrode layer 405a and the drain electrode layer 405b are removed with the use of a mask formed through a photolithography process, so that the island-shaped oxide semiconductor layer 403 is formed in a region between the source electrode layer 405a and the drain electrode layer 405b (see FIG. 6C).

In this embodiment, the oxide semiconductor layer 413 is formed, the regions of the oxide semiconductor layer 413 which overlap with the source electrode layer 405a and the drain electrode layer 405b are removed by the polishing treatment, and the etching treatment is selectively performed, whereby the island-shaped oxide semiconductor layer 403 is formed; however, an embodiment of the present invention is not limited thereto. The island-shaped oxide semiconductor layer 403 may be formed in such a manner that the formed oxide semiconductor layer 413 is processed in the channel-width direction by selective etching treatment, and then is processed in the channel-length direction by removal of the regions of the oxide semiconductor layer 413 which overlap with the source electrode layer 405a and the drain electrode layer 405b through polishing treatment.

In this embodiment, the top of the source electrode layer 405a and the drain electrode layer 405b is substantially aligned with the top of the oxide semiconductor layer 403. Note that the shape of the oxide semiconductor layer 403 may differ depending on the conditions of the polishing treatment of the oxide semiconductor layer 413, and for example, the top of the oxide semiconductor layer 403 may be in contact with the side surface of the source electrode layer 405a or the drain electrode layer 405b in the channel-length direction.

After the island-shaped oxide semiconductor layer 403 is formed, the gate insulating layer 402, the gate electrode layer 401, the conductive layer 411, the sidewall insulating layer 412, the insulating layer 406, the insulating layer 407, the wiring layer 435a, and the wiring layer 435b are formed in a manner similar to that in the step described in Embodiment 1 with reference to FIG. 3D and FIGS. 4A to 4D. Through the above-described process, the transistor 424 of this embodiment can be formed (see FIG. 6D).

When the island-shaped oxide semiconductor layer 403 is formed in the method for manufacturing the transistor described in this embodiment, etching treatment using a resist mask is not used for the processing in the channel-length direction in the step of removing the regions of the oxide semiconductor layer 413 which overlap with the source electrode layer 405a and the drain electrode layer 405b; thus, precise processing can be accurately performed even in the case where the lengths (in the channel-length direction) of the source electrode layer 405a and the drain electrode layer 405b are scaled down. Thus, in the manufacturing process of the semiconductor device, the transistor 424 having a miniaturized structure and little variation in shapes and characteristics can be manufactured with high yield.

Note that in the transistors 420, 422, and 424, the sidewall insulating layer 412 is in contact with part of the upper surface of the conductive layer 411; however, an embodiment of the present invention is not limited thereto. The size of the sidewall insulating layer 412 (the length in the channel-length direction or the film thickness of the sidewall insulating layer) can be set as appropriate by controlling the etching treatment of the insulating layer 416.

Figure 7A:
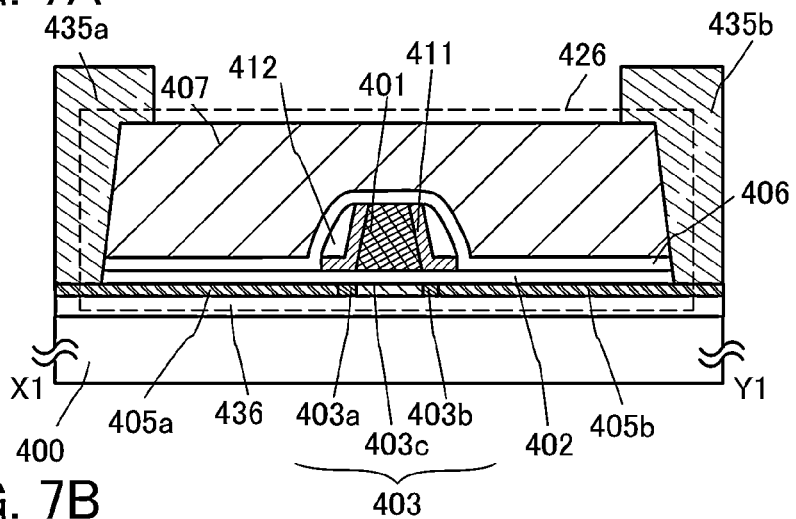
FIGS. 7A to 7C are cross-sectional views each illustrating an embodiment of a semiconductor device.

For example, like the transistor 426 illustrated in FIG. 7A, the height of the sidewall insulating layer 412 (the distance between the surface of the substrate 400 and the upper surface of the sidewall insulating layer 412) may be the same as the height of the conductive layer 411 (the distance between the surface of the substrate 400 and the upper surface of the conductive layer 411). Alternatively, like the transistor 428 illustrated in FIG. 7B, the height of the sidewall insulating layer 412 (the distance between the surface of the substrate 400 and the upper surface of the sidewall insulating layer 412) may be lower than that of the conductive layer 411 (the distance between the surface of the substrate 400 and the upper surface of the conductive layer 411). In the transistor 428, the top of the sidewall insulating layer 412 is in contact with the side surface of the conductive layer 411. Note that the transistor 426 and the transistor 428 illustrated in FIGS. 7A and 7B can have a structure similar to that of the transistor 420 illustrated in FIGS. 1A and 1B except for the size of the sidewall insulating layer 412.

In addition, when the gate electrode layer 401 is patterned and/or when the conductive film 415 is etched using the sidewall insulating layer 412 as a mask, part of the gate insulating layer 402 may be etched depending on the conditions of the etching treatment.

Figure 7B:
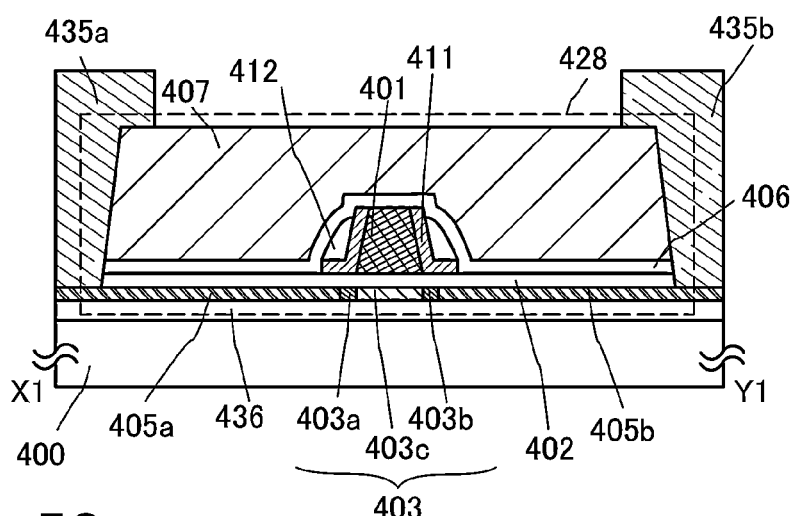
Figure 7C:
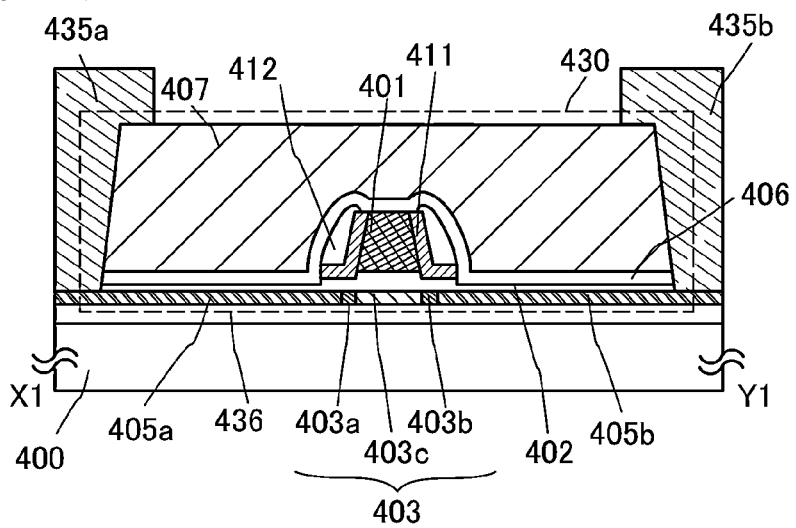

For example, the transistor 430 illustrated in FIG. 7C is an example in which the thickness of the gate insulating layer 402 is reduced in the etching treatment for forming the gate electrode layer 401 and in the etching treatment for forming the conductive layer 411. In the transistor 430, the thickness of the gate insulating layer 402 is larger in the region overlapping with the gate electrode layer 401 than in the region overlapping with the conductive layer 411. Further, the thickness of the gate insulating layer 402 is larger in the region overlapping with the conductive layer 411 than in the region overlapping neither with the conductive layer 411 nor with the gate electrode layer 401.

Note that this embodiment is not limited to the above structure. For example, there is a possibility that a region of the gate insulating layer 402 (the region not overlapping with the gate electrode layer 401) is reduced in the etching treatment for forming the gate electrode layer 401 and the thickness of the gate insulating layer 402 is not reduced in the etching treatment for forming the conductive layer 411.

In the transistor described in this embodiment, an impurity region is formed in the oxide semiconductor layer 403 in a self-aligned manner using the gate electrode layer 401 as a mask, and then, the conductive layer 411 in contact with the side surface of the gate electrode layer 401 and overlapping with the source electrode layer 405a and the drain electrode layer 405b in the channel-length direction is formed. Thus, an Lov region can be formed while a scaled-down channel length is maintained, so that a miniaturized transistor in which a decrease in on-state current is suppressed can be provided.

Further, the conductive layer 411 serving as part of the gate electrode layer 401 is formed without an etching step using a resist mask: the insulating layer 416 provided over the gate electrode layer 401 with the conductive film 415 provided therebetween is processed into the sidewall insulating layer 412 in a self-aligned manner, and then, the conductive film 415 is etched using the sidewall insulating layer as a mask. Accordingly, precise processing can be accurately performed. Thus, in the manufacturing process of the semiconductor device, the miniaturized transistor having little variation in shapes and characteristics can be manufactured with high yield.

The methods and structures described in this embodiment can be combined as appropriate with any of the methods and structures described in the other embodiments.

(Embodiment 3)

In this embodiment, an example of a semiconductor device which includes the transistor described in this specification, which can hold stored data even when not powered, and which does not have a limitation on the number of write cycles, will be described with reference to drawings.

Figure 8A:
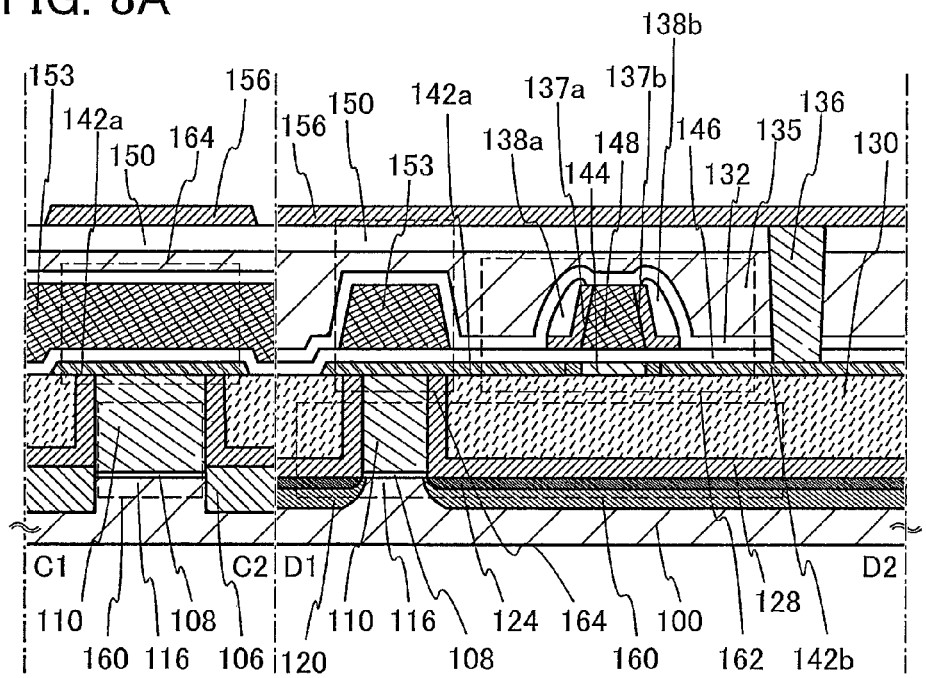
FIGS. 8A to 8C are a cross-sectional view, a plan view, and a circuit diagram illustrating an embodiment of a semiconductor device.
Figure 8B:
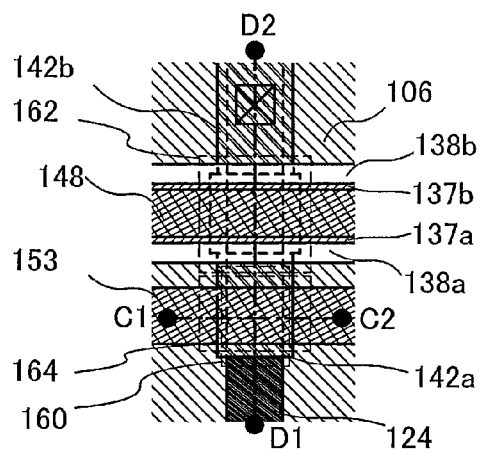
Figure 8C:
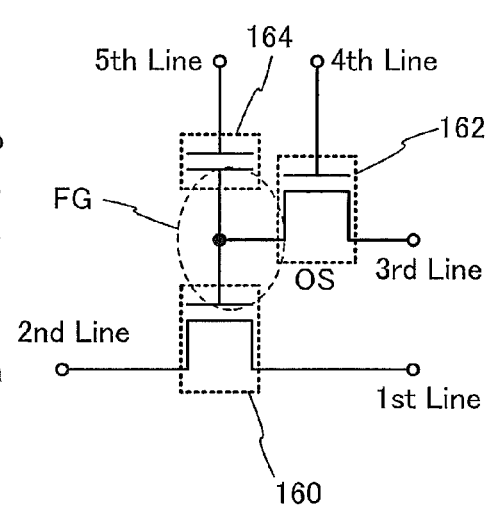

FIGS. 8A and 8B illustrate an example of a structure of a semiconductor device. FIG. 8A is a cross-sectional diagram of the semiconductor device, FIG. 8B is a plan view of the semiconductor device, and FIG. 8C is a circuit diagram of the semiconductor device. Here, FIG. 8A corresponds to a cross section along line C1-C2 and line D1-D2 in FIG. 8B.

The semiconductor device illustrated in FIGS. 8A and 8B includes a transistor 160 using a first semiconductor material in its lower portion, and a transistor 162 using a second semiconductor material in its upper portion. The transistor of an embodiment of the present invention described in Embodiment 1 or 2 can be employed as the transistor 162. In this embodiment, an example in which the structure of the transistor 420 described in Embodiment 1 is applied to the transistor 162 will be described.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables holding of charge for a long time owing to its characteristics.

Although all the transistors are n-channel transistors here, it is needless to say that p-channel transistors can be used. The specific structure of the semiconductor device, such as the material used for the semiconductor device and the structure of the semiconductor device, is not necessarily limited to those described here. For example, the transistor including an oxide semiconductor described in Embodiment 1 or Embodiment 2 may be used as the transistor 162 for holding data.

The transistor 160 in FIG. 8A includes a channel formation region 116 provided in a substrate 100 containing a semiconductor material (e.g., silicon), impurity regions 120 provided such that the channel formation region 116 is sandwiched therebetween, intermetallic compound regions 124 in contact with the impurity regions 120, a gate insulating layer 108 provided over the channel formation region 116, and a gate electrode layer 110 provided over the gate insulating layer 108. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

An element isolation insulating layer 106 is provided over the substrate 100 to surround the transistor 160. Insulating layers 128 and 130 are provided to cover the transistor 160. Note that, in the transistor 160, the sidewall insulating layers may be formed on side surfaces of the gate electrode layer 110 and the impurity regions 120 may include a region having a different impurity concentration.

The transistor 160 including a single crystal semiconductor substrate can operate at high speed. Thus, when the transistor is used as a reading transistor, data can be read at a high speed. Two insulating films are formed so as to cover the transistor 160 in this embodiment. Note that the number of insulating films may be one, or may be three or more. As treatment prior to formation of the transistor 162 and a capacitor 164, CMP treatment is performed on the insulating film formed over the transistor 160, whereby an insulating layer 128 and an insulating layer 130 which are planarized are formed and, at the same time, an upper surface of the gate electrode layer 110 is exposed.

As each of the insulating layer 128 and the insulating layer 130, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating layer 128 and the insulating layer 130 can be formed by a plasma-enhanced CVD method, a sputtering method, or the like.

Alternatively, an organic material such as polyimide, an acrylic resin, or a benzocyclobutene resin can be used. Other than such organic materials, it is also possible to use a low-dielectric constant material (a low-k material) or the like. In the case of using an organic material, a wet process such as a spin coating method or a printing method may be used to form the insulating layer 128 and the insulating layer 130.

Note that in this embodiment, a silicon nitride film is used as the insulating layer 128 and a silicon oxide film is used as the insulating layer 130.

Planarization treatment is preferably performed on the surface of the insulating layer 130, on which an oxide semiconductor layer 144 is to be formed. In this embodiment, the oxide semiconductor layer 144 is formed over the insulating layer 130 sufficiently planarized by polishing treatment such as CMP treatment (the average surface roughness of the surface of the insulating layer 130 is preferably less than or equal to 0.15 nm).

The transistor 162 shown in FIG. 8A uses an oxide semiconductor for its channel formation region. Here, an oxide semiconductor layer 144 included in the transistor 162 is preferably highly purified. By using a highly purified oxide semiconductor, the transistor 162 which has extremely favorable off-state current characteristics can be obtained.

Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

The transistor 162 includes the oxide semiconductor layer 144 including a pair of impurity regions and a channel formation region, and an electrode layer 142a and an electrode layer 142b which are in contact with side surfaces of the oxide semiconductor layer 144 in the channel length direction in the impurity regions. Thus, contact resistance between the oxide semiconductor layer 144 and the electrode layer 142a or the electrode layer 142b can be reduced, and the on-state current of the transistor 162 can be increased.

The transistor 162 includes conductive layers 137a and 137b on side surfaces of a gate electrode layer 148 in the channel-length direction, so that the conductive layers 137a and 137b overlap with the electrode layers 142a and 142b, respectively, with a gate insulating layer 146 provided therebetween, which enables the transistor 162 to substantially have an Lov region, leading to suppression of a decrease in on-state current of the transistor 162.

Further, the conductive layers 137a and 137b are formed by using sidewall insulating layers 138a and 138b as masks. The thickness of the conductive layers 137a and 137b is small to such a level that coverage failure by a sputtering method does not cause a problem; thus, in the transistor 162, occurrence of leakage current due to the conductive layers 137a and 137b can be suppressed.

Insulating layers 132, 135, and 150 each of which has a single-layer structure or a layered structure is provided over the transistor 162. In this embodiment, an aluminum oxide film is used as the insulating layers 132 and 150. The aluminum oxide film has a high density (film density higher than or equal to 3.2 g/cm$^3$, preferably higher than or equal to 3.6 g/cm$^3$), whereby the transistor 162 can have stable electrical characteristics.

A conductive layer 153 is provided in a region overlapping with the source electrode layer 142a of the transistor 162 with the gate insulating layer 146 interposed therebetween; a capacitor 164 includes the source electrode layer 142a, the gate insulating layer 146, and the conductive layer 153. That is, the electrode layer 142a of the transistor 162 functions as one electrode of the capacitor 164, and the conductive layer 153 functions as the other electrode of the capacitor 164. Note that the capacitor 164 may be omitted if a capacitor is not needed. Alternatively, the capacitor 164 may be separately provided above the transistor 162.

In this embodiment, the conductive layer 153 can be formed in the same manufacturing step as the gate electrode layer 148 of the transistor 162. Note that a conductive layer or a sidewall layer may be provided also on a side surface of the conductive layer 153 in the step of forming the conductive layers 137a and 137b and the sidewall layers 138a and 138b on the side surfaces of the gate electrode layer 148.

A wiring 156 for connecting the transistor 162 to another transistor is provided over the insulating layer 150. The wiring 156 is electrically connected to the electrode layer 142b through an electrode layer 136 formed in an opening provided in the insulating layer 150, the insulating layer 135, the insulating layer 132, the gate insulating layer 146, and the like.

In FIGS. 8A and 8B, the transistor 160 and the transistor 162 are provided so as to overlap with each other at least partly. The source region or the drain region of the transistor 160 is preferably provided so as to overlap with part of the oxide semiconductor layer 144. Further, the transistor 162 and the capacitor 164 are provided so as to overlap with at least part of the transistor 160. For example, the conductive layer 153 of the capacitor 164 is provided to at least partly overlap with the gate electrode layer 110 of the transistor 160. With such a planar layout, the area occupied by the semiconductor device can be reduced; thus, higher integration can be achieved.

Note that the electrical connection between the electrode layer 142b and the wiring 156 may be established by direct contact of the electrode layer 142b and the wiring 156 without providing the electrode layer 136. Alternatively, the electrical connection may be established through a plurality of electrode layers.

Next, an example of a circuit configuration corresponding to FIGS. 8A and 8B is illustrated in FIG. 8C.

In FIG. 8C, a first wiring (1st Line) is electrically connected to a source electrode layer of the transistor 160. A second wiring (2nd Line) is electrically connected to a drain electrode layer of the transistor 160. A third wiring (3rd Line) is electrically connected to one of the source electrode layer and the drain electrode layer of the transistor 162, and a fourth wiring (4th Line) is electrically connected to a gate electrode layer of the transistor 162. A gate electrode layer of the transistor 160 and the other of the source and drain electrode layers of the transistor 162 are electrically connected to one electrode of a capacitor 164. A fifth wiring (5th Line) is electrically connected to the other electrode of the capacitor 164.

The semiconductor device in FIG. 8C utilizes a characteristic in which the potential of the gate electrode layer of the transistor 160 can be held, and thus enables data writing, holding, and reading as follows.

Writing and holding of data will be described. First, the potential of the fourth line is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, charge for supply of a potential level or charge for supply of a different potential level (hereinafter referred to as a low-level charge and a high-level charge) is given. After that, the potential of the fourth wiring is set to a potential at which the transistor 162 is turned off, so that the transistor 162 is turned off. Thus, the charge given to the gate electrode layer of the transistor 160 is held (holding).

Since the off-state current of the transistor 162 is extremely small, the charge of the gate electrode layer of the transistor 160 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode layer of the transistor 160. This is because in general, when the transistor 160 is an n-channel transistor, an apparent threshold voltage $V_{th\_H}$ in the case where the high-level charge is given to the gate electrode layer of the transistor 160 is lower than an apparent threshold voltage $V_{th\_L}$ in the case where the low-level charge is given to the gate electrode layer of the transistor 160.

Here, an apparent threshold voltage refers to the potential of the fifth line, which is needed to turn on the transistor 160. Thus, the potential of the fifth wiring is set to a potential $V_0$ intermediate between $V_{th\_H}$ and $V_{th\_L}$, whereby charge supplied to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the case where such reading is not performed, a potential at which the transistor 160 is turned off regardless of the state of the gate electrode layer of the transistor 160, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth wiring.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional non-volatile memory, and reliability thereof is drastically improved. Furthermore, data is written depending on the on state and the off state of the transistor, whereby high-speed operation can be easily realized.

As described above, a semiconductor device in which miniaturization and higher integration is achieved and which is having high electrical characteristics and a method for manufacturing the semiconductor device can be provided.

The methods and structures described in this embodiment can be combined as appropriate with any of the methods and structures described in the other embodiments.

(Embodiment 4)

In this embodiment, a semiconductor device which includes the transistor described in Embodiment 1 or 2, which can hold stored data even when not powered, and which does not have a limitation on the number of write cycles, and which has a structure different from the structure described in Embodiment 3 is described with reference to FIGS. 9A and 9B and FIGS. 10A and 10B.

Figure 9A:
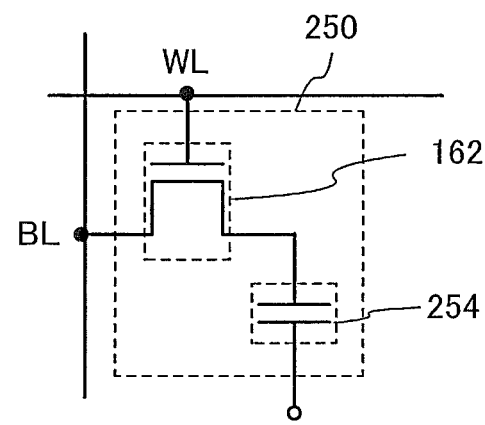
FIGS. 9A and 9B are a circuit diagram and a perspective view illustrating an embodiment of a semiconductor device.
Figure 9B:
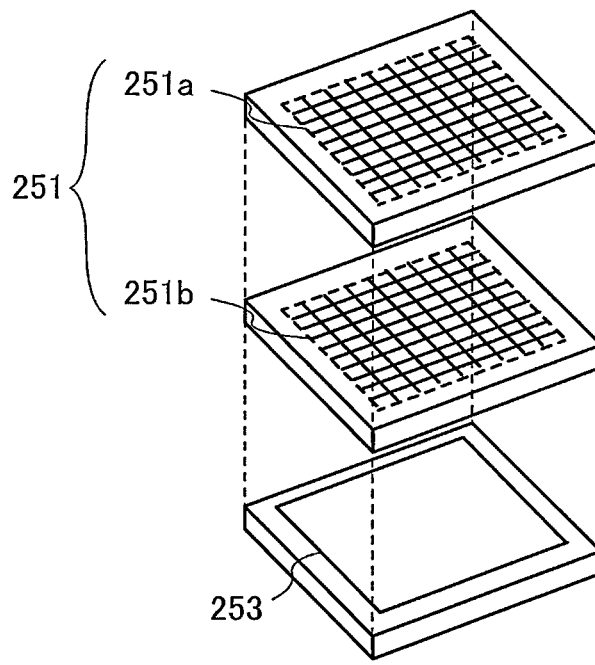

FIG. 9A illustrates an example of a circuit configuration of a semiconductor device, and FIG. 9B is a conceptual diagram illustrating an example of a semiconductor device. First, the semiconductor device illustrated in FIG. 9A is described, and then, the semiconductor device illustrated in FIG. 9B is described.

In the semiconductor device illustrated in FIG. 9A, a bit line BL is electrically connected to a source electrode layer or a drain electrode layer of the transistor 162, a word line WL is electrically connected to a gate electrode layer of the transistor 162, and the source electrode layer or the drain electrode layer of the transistor 162 is electrically connected to a first terminal of a capacitor 254.

Next, writing and holding of data in the semiconductor device (a memory cell 250) illustrated in FIG. 9A is described.

First, the potential of the word line WL is set to a potential at which the transistor 162 is turned on, and the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential at the first terminal of the capacitor 254 is held (holding).

The transistor 162 including an oxide semiconductor has extremely small off-state current. For that reason, a potential of the first terminal of the capacitor 254 (or a charge accumulated in the capacitor 254) can be held for an extremely long period by turning off the transistor 162.

Secondly, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL, in the case of holding the potential $V_1$, ($=(C_B \times V_{B0} + C \times V_1)/(C_B + C)$) is higher than the potential of the bit line BL, in the case of holding the potential $V_0$, ($=(C_B \times V_{B0} + C \times V_0)/(C_B + C)$).

Then, by comparing the potential of the bit line BL with a predetermined potential, data can be read.

As described above, the semiconductor device illustrated in FIG. 9A can hold charge that is accumulated in the capacitor 254 for a long time because the off-state current of the transistor 162 is extremely low. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 9B will be described.

The semiconductor device illustrated in FIG. 9B includes memory cell arrays 251a and 251b including a plurality of memory cells 250 illustrated in FIG. 9A as memory circuits in the upper portion, and a peripheral circuit 253 in the lower portion which is necessary for operating a memory cell array 251 (the memory cell arrays 251a and 251b). Note that the peripheral circuit 253 is electrically connected to the memory cell array 251.

In the structure illustrated in FIG. 9B, the peripheral circuit 253 can be provided under the memory cell array 251 (memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 9B illustrates, as an example, the semiconductor device in which two memory cell arrays 251 (the memory cell arrays 251a and 251b) are stacked; however, the number of memory cells to be stacked is not limited thereto. Three or more memory cells may be stacked.

Next, a specific structure of the memory cell 250 illustrated in FIG. 9A will be described with reference to FIGS. 10A and 10B.

Figure 10A:
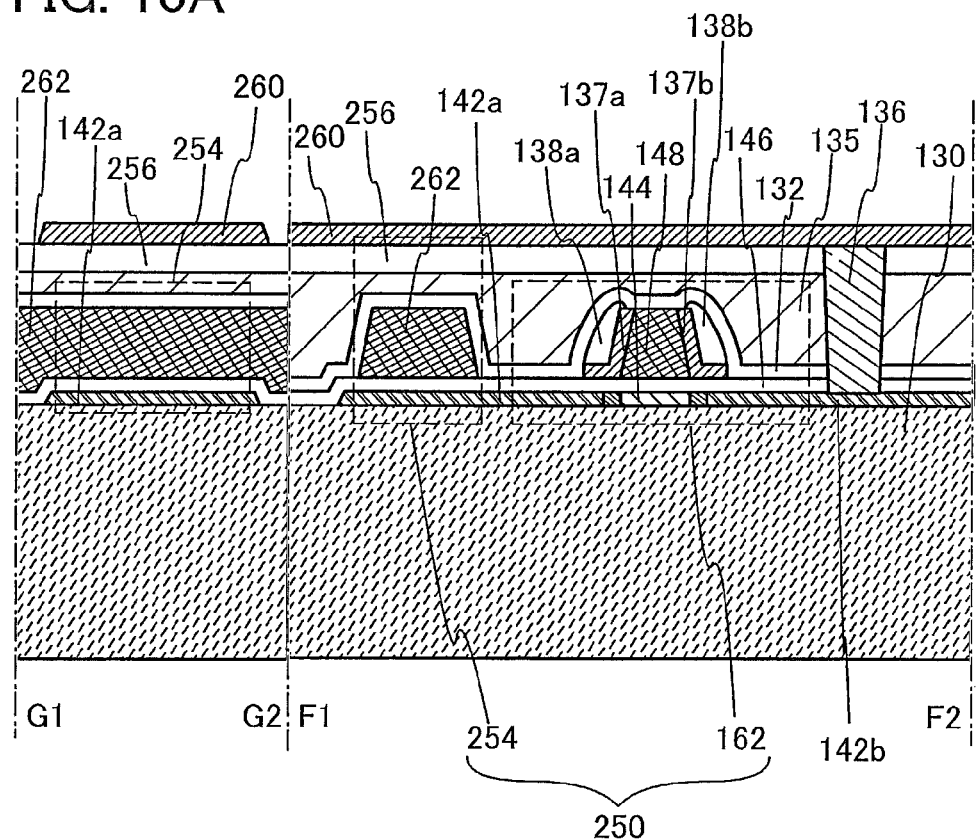
FIGS. 10A and 10B are a cross-sectional view and a plan view illustrating an embodiment of a semiconductor device.
Figure 10B:
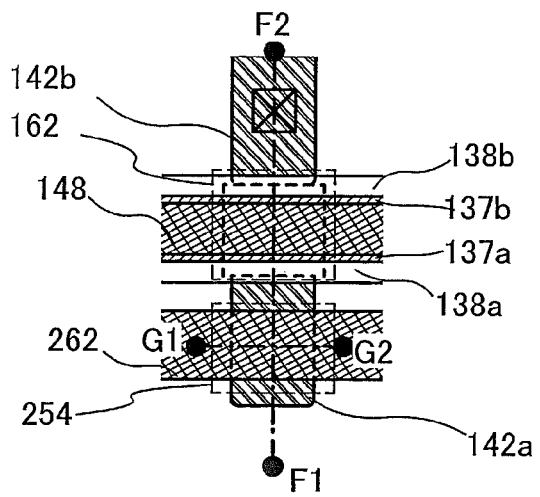

FIGS. 10A and 10B illustrate an example of a structure of the memory cell 250. FIGS. 10A and 10B are respectively a cross-sectional view and a plan view of the memory cell 250. Here, FIG. 10A illustrates cross sections taken along line F1-F2 and line G1-G2 of FIG. 10B.

The transistor 162 in FIGS. 10A and 10B can have the same structure as the transistor in Embodiment 1 or 2. In this embodiment, an example of the same structure as the transistor 420 in FIGS. 1A and 1B is described.

A conductive layer 262 is provided in a region overlapping with the electrode layer 142a of the transistor 162 with the gate insulating layer 146 interposed therebetween, and the electrode layer 142a, the gate insulating layer 146, and the conductive layer 262 form a capacitor 254. That is, the electrode layer 142a of the transistor 162 functions as one electrode of the capacitor 254, and the conductive layer 262 functions as the other electrode of the capacitor 254.

The insulating layer 132, the insulating layer 135, and an insulating layer 256 having a single-layer structure or a layered structure is provided over the transistor 162 and the capacitor 254. Further, a wiring layer 260 for connecting the memory cell 250 to an adjacent memory cell 250 is provided over the insulating layer 256. The wiring layer 260 is electrically connected to the electrode layer 142b of the transistor 162 through an opening formed in the insulating layer 256, the insulating layer 135, the insulating layer 132, and the gate insulating layer 146. Note that the wiring layer 260 may be directly connected to the electrode layer 142b. Note that the wiring layer 260 corresponds to the bit line BL in the circuit diagram of FIG. 9A.

In FIGS. 10A and 10B, the electrode layer 142b of the transistor 162 can also function as a source electrode layer of a transistor included in an adjacent memory cell. With such a planar layout, the area occupied by the semiconductor device can be reduced; thus, higher integration can be achieved.

The plurality of memory cells formed in multiple layers is each formed with a transistor including an oxide semiconductor. Since the off-state current of the transistor including an oxide semiconductor is small, stored data can be held for a long time owing to such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a semiconductor device in which miniaturization and higher integration is achieved and having high electrical characteristics and a method for manufacturing the semiconductor device can be provided.

This embodiment can be implemented in appropriate combination with the structures described in the other embodiments.

(Embodiment 5)

In this embodiment, examples of application of the semiconductor device described in any of the above embodiments to portable devices such as cellular phones, smartphones, or e-book readers are described with reference to FIGS. 11A and 11B, FIG. 12, FIG. 13, and FIG. 14.

In portable devices such as a mobile phone, a smartphone, and an e-book reader, an SRAM or a DRAM is used so as to store image data temporarily. An SRAM or a DRAM is used because a flash memory, whose response is slow, is unsuitable to be used for image processing. On the other hand, an SRAM or a DRAM has the following characteristics when used for temporary storage of image data.

Figure 11A:
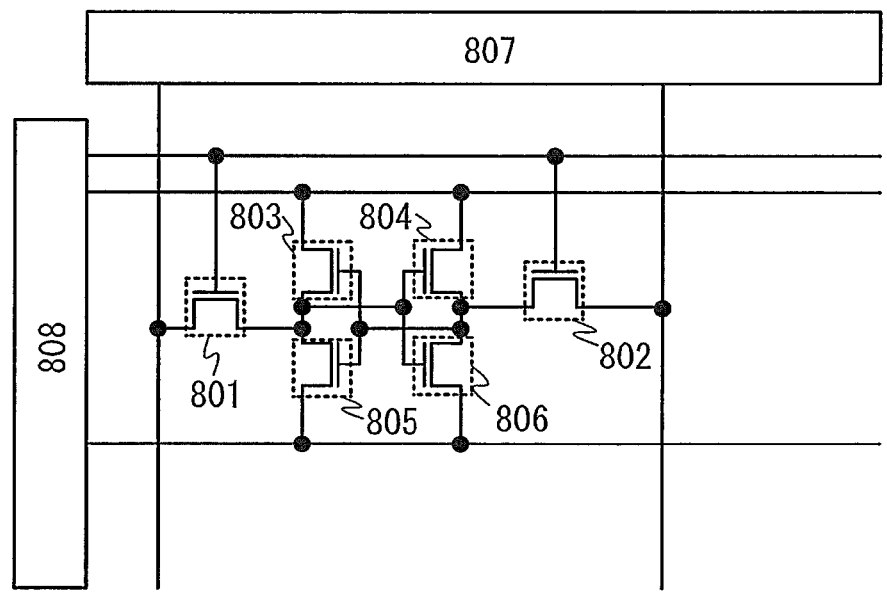
FIGS. 11A and 11B are circuit diagrams each illustrating an embodiment of a semiconductor device.

In an ordinary SRAM, as illustrated in FIG. 11A, one memory cell includes six transistors, that is, transistors 801 to 806, which are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 11B:
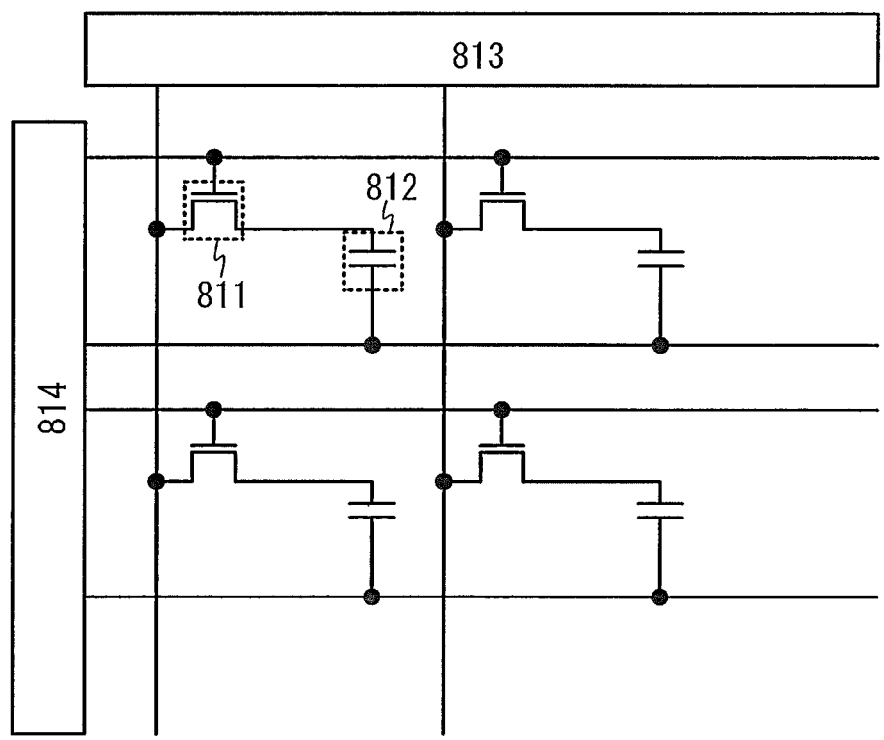

On the other hand, as shown in FIG. 11B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to 10 $F^2$. Note that the DRAM needs to be refreshed periodically and consumes electric power even when a rewriting operation is not performed.

However, the area of the memory cell of the semiconductor device described the above embodiments is about 10 $F^2$ and frequent refreshing is not needed. Therefore, the area of a memory cell can be decreased, and power consumption can be reduced.

Figure 12:
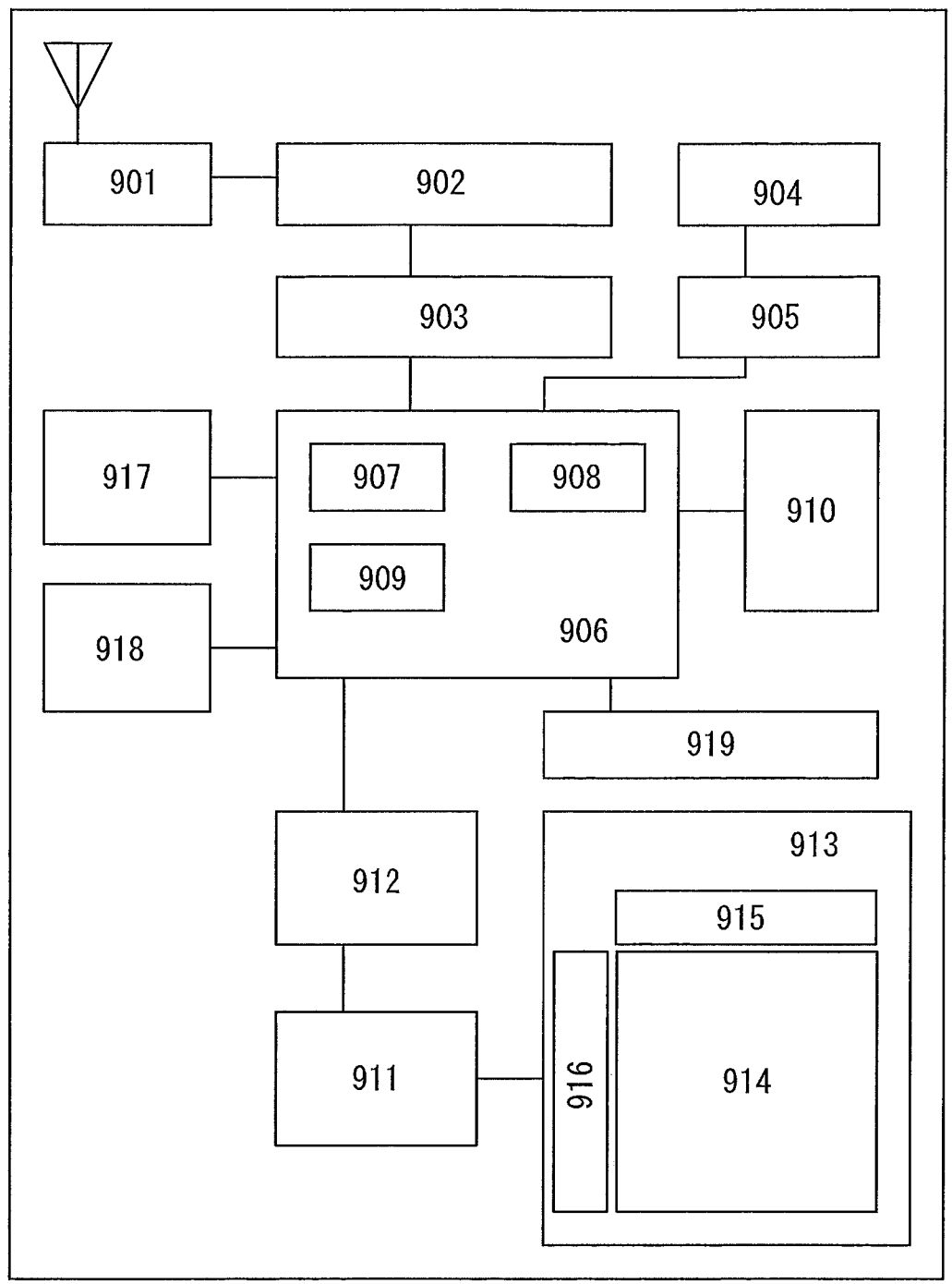
FIG. 12 is a block diagram illustrating an embodiment of a semiconductor device.

Next, a block diagram of a portable device is illustrated in FIG. 12. The portable device illustrated in FIG. 12 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, it is possible to provide a portable device in which writing and reading of data can be performed at high speed, data can be held for a long time, and power consumption can be sufficiently reduced.

Figure 13:
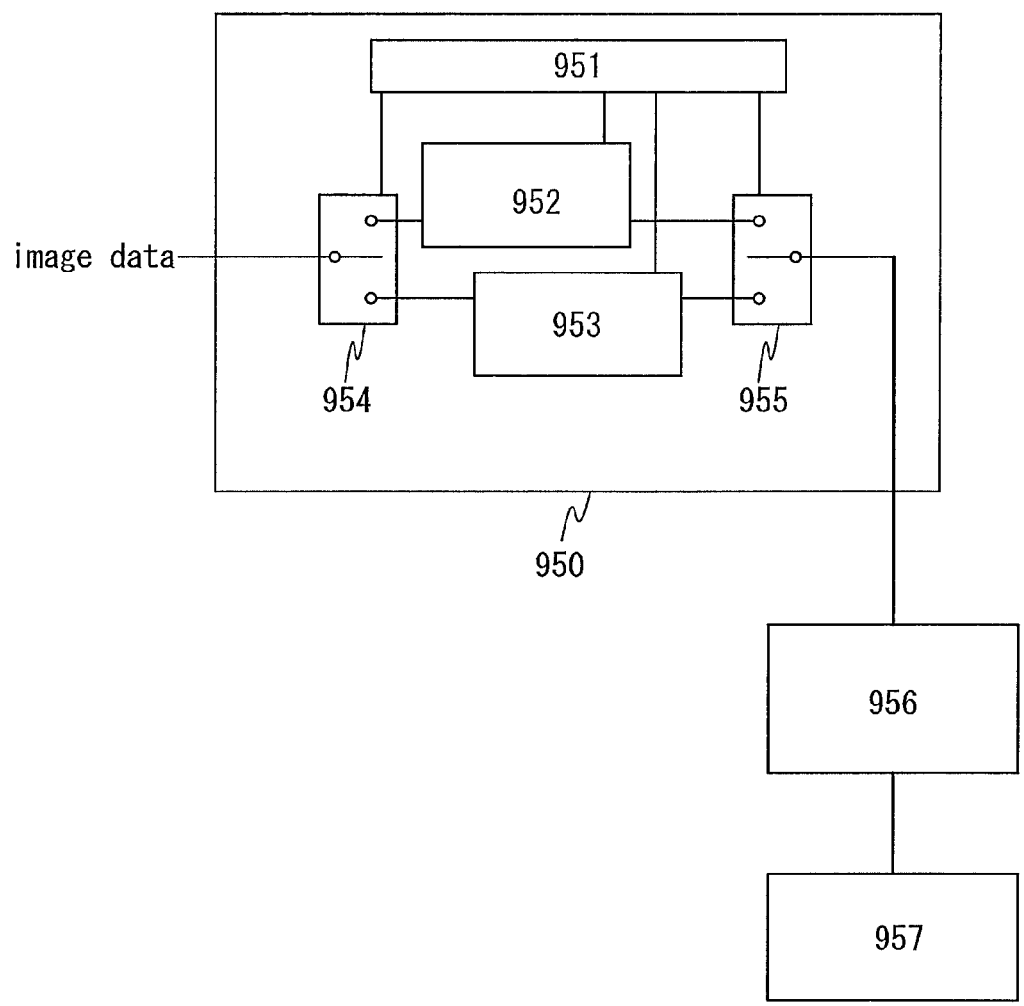
FIG. 13 is a block diagram illustrating an embodiment of a semiconductor device.

FIG. 13 illustrates an example of using the semiconductor device described in any of the above embodiments in a memory circuit 950 for a display. The memory circuit 950 illustrated in FIG. 13 includes a memory 952, a memory 953, a switch 954, a switch 955, and a memory controller 951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is formed by an application processor (not shown). The input image data A is stored in the memory 952 through the switch 954. The image data (stored image data A) stored in the memory 952 is transmitted and displayed to the display 957 through the switch 955 and the display controller 956.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 953 through the switch 954. The stored image data A is read periodically from the memory 952 through the switch 955 even during that time. After the completion of storing the new image data (stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. The memories 952 and 953 are not necessarily different memories, and a memory region included in one memory may be divided to be used. By employing the semiconductor device described in any of the above embodiments for the memory 952 and the memory 953, data can be written and read at high speed and held for a long time, and power consumption can be sufficiently reduced.

Figure 14:
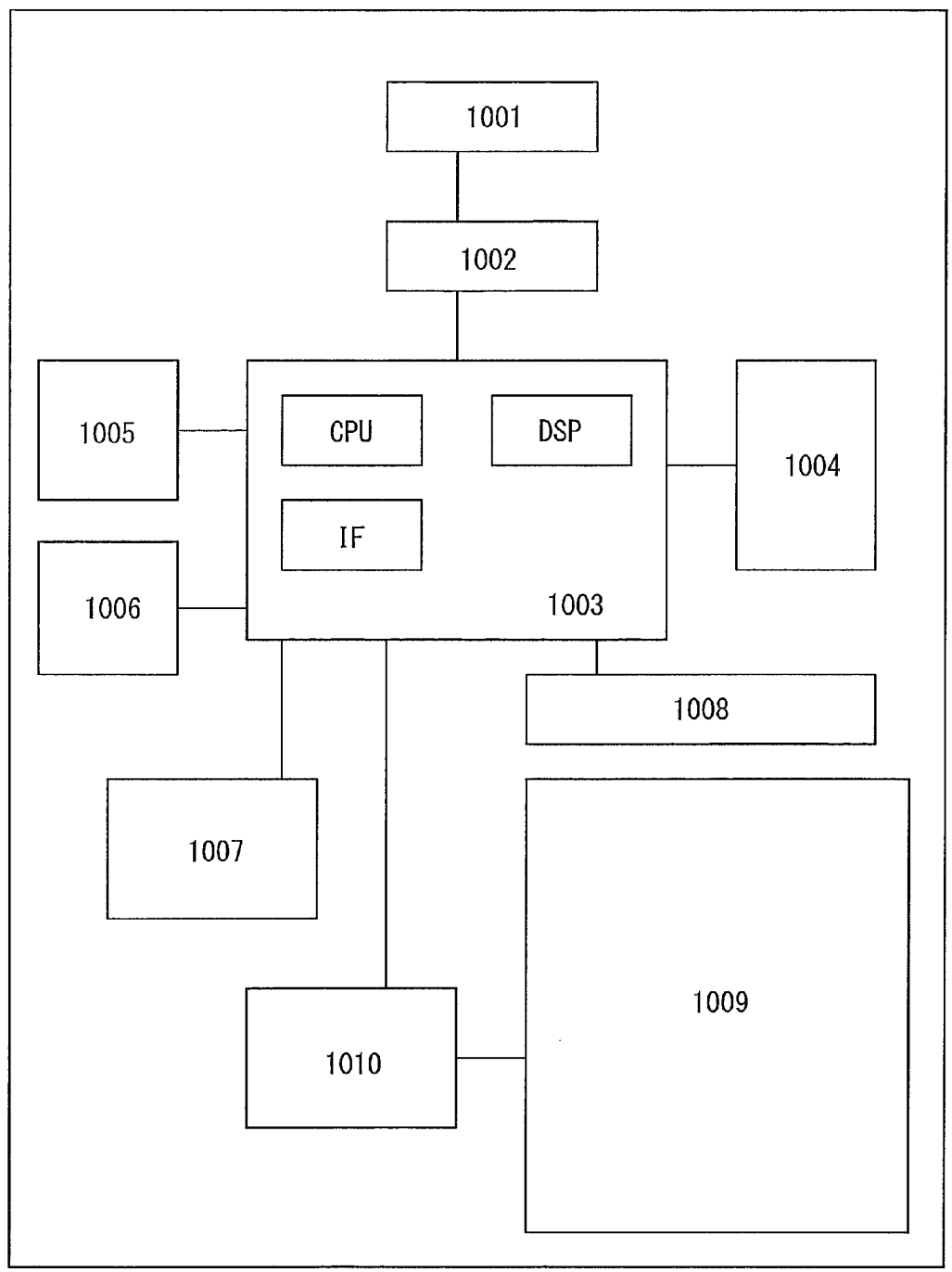
FIG. 14 is a block diagram illustrating an embodiment of a semiconductor device.

Next, a block diagram of an e-book reader is illustrated in FIG. 14. The e-book reader in FIG. 14 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 14. The memory circuit 1007 has a function of temporarily holding the contents of a book. For example, a user may use a highlight function. In some cases, a user wants to mark a specific portion while reading e-book. This marking function is called a highlight function and is used to make a difference from the other portions by changing the display color, underlining, making characters bold, changing the font of characters, or the like. The function makes it possible to store and hold data of a portion specified by a user. In order to store the data for a long time, the data stored in the memory circuit 1007 may be copied to the flash memory 1004. Also in such a case, by employing the semiconductor device described in any of the above embodiments, data can be written and read at high speed and held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

EXAMPLE

In this example, a conductive film was processed by the method for manufacturing a semiconductor device of one embodiment of the present invention, and it was confirmed that a gate electrode layer and a conductive layer on the side surface of the gate electrode layer, which had the shape shown in Embodiment 1, could be obtained.

A method for manufacturing a sample of Example will be shown below.

First, a silicon substrate was prepared, and a silicon nitride oxide film was deposited to a thickness of 20 nm over the substrate by a CVD method. This silicon nitride oxide film corresponds to the gate insulating layer of the transistor according to one embodiment of the present invention; thus, it is referred to as a gate insulating layer in this example.

Then, a conductive film was formed over the gate insulating layer. As the conductive film, a tantalum nitride film with a thickness of 30 nm was deposited by a sputtering method under a mixed atmosphere of argon and nitrogen ($Ar:N_2=50$ sccm:10 sccm) at a pressure of 0.6 Pa and a power of 1 kW, and thereover, a tungsten film with a thickness of 135 nm was deposited by a sputtering method under an argon atmosphere ($Ar=100$ sccm) at a pressure of 2.0 Pa and a power of 4 kW.

After that, the tungsten film was subjected to inductively coupled plasma (ICP) etching treatment under a mixed atmosphere of chlorine, carbon tetrafluoride, and oxygen ($Cl2:CF_4:O_2=45$ sccm:55 sccm:55 sccm), at a power of 3 kW, a bias power of 50 W, and a pressure of 0.67 Pa, whereby a patterned tungsten layer was obtained.

Then, the tantalum nitride film was subjected to ICP etching treatment under a chlorine atmosphere ($Cl_2=100$ sccm) at a power of 1 kW, a bias power of 60 W, and a pressure of 0.2 Pa, whereby a patterned tantalum nitride layer was obtained. A stack of the tantalum nitride layer and the tungsten layer corresponds to the gate electrode layer of the transistor according to one embodiment of the present invention; thus, it is referred to as a gate electrode layer in this example.

Next, a tungsten film was deposited to a thickness of 30 nm by a sputtering method so as to cover the gate electrode layer. The deposition was performed under an argon atmosphere ($Ar=50$ sccm) at a pressure of 0.6 Pa and a power of 1 kW.

Then, a silicon nitride oxide film was deposited to a thickness of 150 nm over the tungsten film by a CVD method.

After that, the silicon nitride oxide film was subjected to ICP etching treatment under a mixed atmosphere of trifluoromethane and helium ($CHF_3:He=30$ sccm:120 sccm) at a power of 3 kW, a bias power of 200 W, and a pressure of 2.0 Pa. The silicon nitride oxide film obtained by the etching treatment corresponds to the sidewall insulating layer of the transistor according to one embodiment of the present invention; thus, it is referred to as a sidewall insulating layer in this example.

Then, with the sidewall insulating layer used as a mask, the tungsten film was subjected to ICP etching treatment under a mixed atmosphere of carbon tetrafluoride, chlorine, and oxygen ($CF_4:Cl_2:O_2=50$ sccm:50 sccm:20 sccm), at a power of 500 W, a bias power of 10 W, and a pressure of 1.6 Pa, whereby a conductive layer (a tungsten layer in this example) was formed on the side surface of the gate electrode layer.

Figure 15:
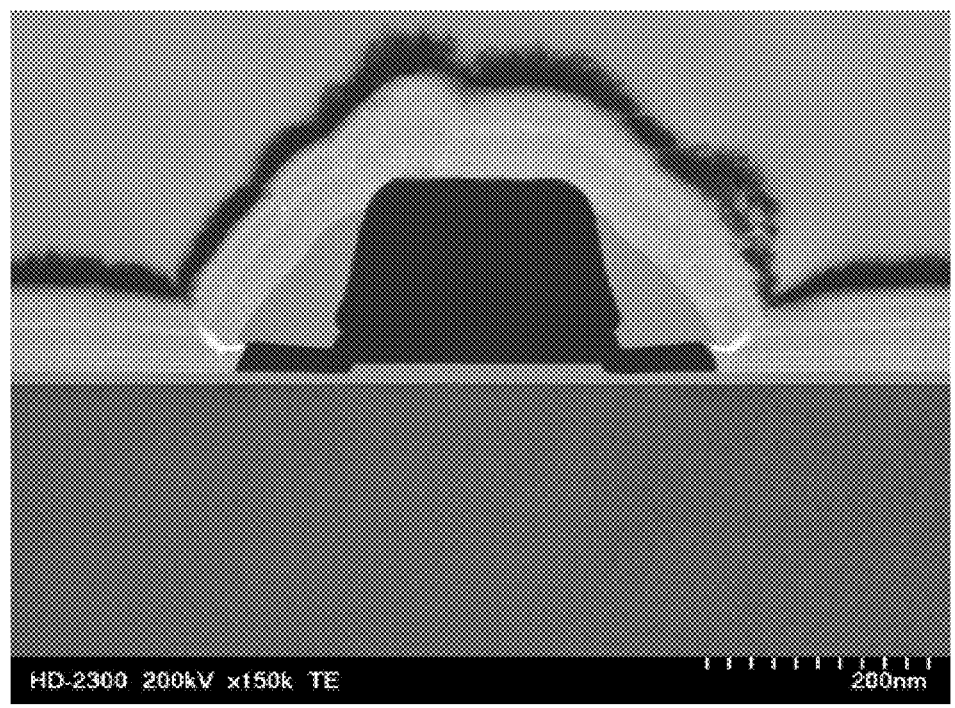
FIG. 15 is a cross-sectional STEM image of a sample manufactured in Example.

The sample of Example manufactured by the aforementioned method was observed by a scanning transmission electron microscopy (STEM), and its cross-sectional image (cross-sectional STEM image) is shown in FIG. 15.

FIG. 15 shows that the gate electrode layer and the conductive layer on the side surface of the gate electrode layer, which have the shape shown in Embodiment 1, could be obtained by the manufacturing method described in this example.

Note that in the sample of Example, like in FIG. 7B, the height of the sidewall insulating layer (the distance between the substrate surface and the upper surface of the sidewall insulating layer) is lower than that of the conductive layer (the distance between the substrate surface and the upper surface of the conductive layer). Further, in FIG. 15, a region of the gate insulating layer which overlaps with the gate electrode layer has a thickness larger than that of another region of the gate insulating layer which overlaps with the conductive layer. Specifically, in the sample of Example, the region of the gate insulating layer which overlaps with the gate electrode layer had a thickness of 17.9 nm, and the region of the gate insulating layer which overlaps with the conductive layer had a thickness of 11.2 nm. It seems that this is because the gate insulating layer as well as the gate electrode layer was etched at the same time.

Note that the side edge of the conductive layer in the sample of this example is provided on the inner side of the side edge of the sidewall insulating layer in the channel length direction. One of the technical ideas of the disclosed invention is that a conductive layer is etched by using as a mask a sidewall insulating layer formed in a self-aligned manner, so that an Lov region in a transistor having a miniaturized structure is formed without a photolithography step. Therefore, a difference as small as misalignment of edges caused by etching conditions and the like in the case where etching is performed using the same mask (or a layer is etched with an upper layer thereof used as a mask), is completely acceptable and the edges of the layers etched using the same mask are considered to be aligned.

This application is based on Japanese Patent Application serial No. 2011-247907 filed with Japan Patent Office on Nov. 11, 2011, the entire contents of which are hereby incorporated by reference.

What is claimed is:

1. A semiconductor device comprising:
a source electrode layer and a drain electrode layer;
an oxide semiconductor layer comprising a first impurity region, a second impurity region, and a channel formation region sandwiched between the first impurity region and the second impurity region, wherein a side surface of the first impurity region is in contact with and under the source electrode layer in a channel-length direction and a side surface of the second impurity region is in contact with and under the drain electrode layer in the channel-length direction;
a gate insulating layer over and in contact with the oxide semiconductor layer, the source electrode layer, and the drain electrode layer;
a gate electrode layer over the gate insulating layer, wherein the gate electrode layer overlaps with the channel formation region;
a conductive layer having a first portion in contact with a side surface of the gate electrode layer and a second portion in contact with an upper surface of the gate insulating layer, wherein at least part of the second portion overlaps with one of the source electrode layer and the drain electrode layer; and
a sidewall insulating layer in contact with an outer side surface of the first portion and an upper surface of the second portion, wherein the sidewall insulating layer is not in contact with the gate electrode layer.

2. The semiconductor device according to claim 1, wherein a side edge of the second portion is aligned with a side edge of the sidewall insulating layer.

3. The semiconductor device according to claim 1, wherein the conductive layer has an L-shape.

4. The semiconductor device according to claim 1, further comprising:
an insulating layer over the gate electrode layer, the sidewall insulating layer, and the gate insulating layer; and
a wiring over the insulating layer, wherein the wiring is in contact with the source electrode layer or the drain electrode layer through an opening provided in the insulating layer and the gate insulating layer.

5. The semiconductor device according to claim 1, wherein the oxide semiconductor layer comprises a material selected from indium, gallium, and zinc.

6. The semiconductor device according to claim 1, wherein the conductive layer comprises the same material as the gate electrode layer.

7. The semiconductor device according to claim 1, wherein the oxide semiconductor layer has a tapered shape.

8. The semiconductor device according to claim 1, wherein a thickness of the gate insulating layer in a region overlapping with the gate electrode layer is greater than a thickness of the gate insulating layer in a region overlapping with the conductive layer.

9. The semiconductor device according to claim 1, wherein a thickness of the gate insulating layer in a region overlapping with the conductive layer is greater than a thickness of the gate insulating layer in a region overlapping neither with the conductive layer nor with the gate electrode layer.

10. A semiconductor device comprising:
a source electrode layer and a drain electrode layer;
an oxide semiconductor layer comprising a first impurity region, a second impurity region, and a channel formation region sandwiched between the first impurity region and the second impurity region, wherein a side surface of the first impurity region is in contact with the source electrode layer in a channel-length direction and a side surface of the second impurity region is in contact with the drain electrode layer in the channel-length direction;
a gate insulating layer over and in contact with the oxide semiconductor layer, the source electrode layer, and the drain electrode layer;
a gate electrode layer over the gate insulating layer, wherein the gate electrode layer overlaps with the channel formation region;
a conductive layer having a first portion in contact with a side surface of the gate electrode layer and a second portion in contact with an upper surface of the gate insulating layer, wherein at least part of the second portion overlaps with one of the source electrode layer and the drain electrode layer; and
a sidewall insulating layer in contact with an outer side surface of the first portion, an upper surface of the first portion, and an upper surface of the second portion, wherein the sidewall insulating layer is not in contact with the gate electrode layer.

11. The semiconductor device according to claim 10, wherein a side edge of the second portion is aligned with a side edge of the sidewall insulating layer.

12. The semiconductor device according to claim 10, wherein the conductive layer has an L-shape.

13. The semiconductor device according to claim 10, further comprising:
an insulating layer over the gate electrode layer, the sidewall insulating layer, and the gate insulating layer; and
a wiring over the insulating layer, wherein the wiring is in contact with the source electrode layer or the drain electrode layer through an opening provided in the insulating layer and the gate insulating layer.

14. The semiconductor device according to claim 10, wherein the oxide semiconductor layer comprises a material selected from indium, gallium, and zinc.

15. The semiconductor device according to claim 10, wherein the conductive layer comprises the same material as the gate electrode layer.

16. The semiconductor device according to claim 10, wherein the oxide semiconductor layer has a tapered shape.

17. The semiconductor device according to claim 10, wherein a thickness of the gate insulating layer in a region overlapping with the gate electrode layer is greater than a thickness of the gate insulating layer in a region overlapping with the conductive layer.

18. The semiconductor device according to claim 10, wherein a thickness of the gate insulating layer in a region overlapping with the conductive layer is greater than a thickness of the gate insulating layer in a region overlapping neither with the conductive layer nor with the gate electrode layer.

* * * * *